US011705534B2

(12) United States Patent
Teo et al.

(10) Patent No.: US 11,705,534 B2
(45) Date of Patent: Jul. 18, 2023

(54) METHODS OF MAKING FLIP CHIP MICRO LIGHT EMITTING DIODES

(71) Applicant: Lumileds LLC, San Jose, CA (US)

(72) Inventors: Yeow Meng Teo, Singapore (SG); Wee-Hong Ng, Singapore (SG); Pei-Chee Mah, Singapore (SG); Chee Chung James Wong, Singapore (SG); Geok Joo Soh, Singapore (SG)

(73) Assignee: Lumileds LLC, San Jose, CA (US)

( * ) Notice: Subject to any disclaimer, the term of this patent is extended or adjusted under 35 U.S.C. 154(b) by 220 days.

(21) Appl. No.: 17/213,390

(22) Filed: Mar. 26, 2021

(65) Prior Publication Data

US 2022/0173267 A1   Jun. 2, 2022

Related U.S. Application Data

(60) Provisional application No. 63/119,745, filed on Dec. 1, 2020.

(51) Int. Cl.
*H01L 33/00* (2010.01)
*H01L 25/075* (2006.01)

(52) U.S. Cl.
CPC ........ *H01L 33/007* (2013.01); *H01L 25/0753* (2013.01); *H01L 33/0093* (2020.05);
(Continued)

(58) Field of Classification Search
None
See application file for complete search history.

(56) References Cited

U.S. PATENT DOCUMENTS 6,410,942 B1   6/2002   Thibeault et al.
6,657,236 B1   12/2003  Thibeault et al.
(Continued)

FOREIGN PATENT DOCUMENTS

DE   102010051286 A1   5/2012
DE   102012109460 A1   4/2014
(Continued)

OTHER PUBLICATIONS

PCT International Search Report and Written Opinion in PCT/US2021/051650 dated Jan. 10, 2022, 15 pages.
(Continued)

*Primary Examiner* — Bradley Smith
(74) *Attorney, Agent, or Firm* — Servilla Whitney LLC

(57) ABSTRACT

A micro-light emitting diode (uLED) device comprises: a mesa comprising: a plurality of semiconductor layers including an n-type layer, an active layer, and a p-type layer; a p-contact layer contacting the p-type layer; a cathode contacting the first sidewall of the n-type layer; a first region of dielectric material that insulates the p-contact layer, the active layer, and a first sidewall of the p-type layer from the cathode; an anode contacting the top surface of the p-contact layer; and a second region of dielectric material that insulates the active layer, a second sidewall of the p-type layer, and the second sidewall of the n-type layer from the anode. The top surface of the p-contact layer has a different planar orientation compared to the first and second sidewalls of the n-type layer. Methods of making and using the uLED devices are also provided.

19 Claims, 13 Drawing Sheets

(52) U.S. Cl.
CPC .... *H01L 33/0095* (2013.01); *H01L 2933/005* (2013.01); *H01L 2933/0016* (2013.01); *H01L 2933/0025* (2013.01); *H01L 2933/0066* (2013.01)

(56) References Cited

U.S. PATENT DOCUMENTS

| | | |
|---|---|---|
| 6,821,804 B2 | 11/2004 | Thibeault et al. |
| 7,213,942 B2 * | 5/2007 | Jiang .................. H01L 24/24 |
| | | 362/249.02 |
| 7,943,406 B2 | 5/2011 | Slater, Jr. et al. |
| 8,080,828 B2 | 12/2011 | Krames et al. |
| 8,222,811 B2 | 7/2012 | Vaufrey et al. |
| 8,258,044 B2 | 9/2012 | Brun et al. |
| 8,487,340 B2 | 7/2013 | Gilet et al. |
| 8,638,032 B2 | 1/2014 | Maindron et al. |
| 8,647,957 B2 | 2/2014 | Borowik et al. |
| 8,697,548 B2 | 4/2014 | Borowik et al. |
| 8,698,396 B2 | 4/2014 | Maindron et al. |
| 8,729,592 B2 | 5/2014 | Iduka et al. |
| 8,754,426 B2 | 6/2014 | Marx et al. |
| 8,890,111 B2 | 11/2014 | Templier et al. |
| 8,969,900 B2 | 3/2015 | Sabathil et al. |
| 9,093,607 B2 | 7/2015 | Gilet et al. |
| 9,109,296 B2 | 8/2015 | Metaye et al. |
| 9,112,112 B2 | 8/2015 | Do et al. |
| 9,192,290 B2 | 11/2015 | Spinnler et al. |
| 9,209,366 B2 | 12/2015 | Maindron et al. |
| 9,263,633 B2 | 2/2016 | Gilet et al. |
| 9,396,970 B2 | 7/2016 | Gillot et al. |
| 9,422,628 B2 | 8/2016 | Simonato et al. |
| 9,437,782 B2 | 9/2016 | Bower et al. |
| 9,496,465 B2 | 11/2016 | Sugimoto et al. |
| 9,507,204 B2 | 11/2016 | Pelka et al. |
| 9,601,542 B2 | 3/2017 | Robin et al. |
| 9,722,160 B2 | 8/2017 | Nakabayashi |
| 9,768,350 B2 | 9/2017 | Bavencove et al. |
| 9,859,330 B2 | 1/2018 | Von Malm et al. |
| 9,887,184 B2 | 2/2018 | Takeya et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 10,522,712 B2 | 12/2019 | Lai |
| 10,811,460 B2 | 10/2020 | Dimitropoulos et al. |
| 10,923,628 B2 | 2/2021 | Dimitropoulos et al. |
| 10,964,845 B2 | 3/2021 | Dimitropoulos et al. |
| 2002/0139987 A1 | 10/2002 | Collins, III et al. |
| 2005/0211989 A1 | 9/2005 | Horio et al. |
| 2007/0206130 A1 | 9/2007 | Wuu et al. |
| 2008/0099787 A1 | 5/2008 | Coolbaugh et al. |
| 2008/0173884 A1 | 7/2008 | Chitnis et al. |
| 2008/0179602 A1 | 7/2008 | Negley et al. |
| 2010/0078656 A1 | 4/2010 | Seo et al. |
| 2011/0151607 A1 | 6/2011 | Landis et al. |
| 2011/0284910 A1 * | 11/2011 | Iduka .................. H01L 33/385 |
| | | 257/E33.062 |
| 2011/0287606 A1 | 11/2011 | Brun et al. |
| 2012/0050694 A1 | 3/2012 | Huang et al. |
| 2012/0091481 A1 | 4/2012 | Sekine et al. |
| 2012/0205614 A1 | 8/2012 | Templier et al. |
| 2013/0020115 A1 | 1/2013 | Mataye et al. |
| 2013/0112945 A1 | 5/2013 | Gilet et al. |
| 2013/0256708 A1 | 10/2013 | Jin et al. |
| 2014/0077156 A1 | 3/2014 | Bavencove et al. |
| 2014/0094878 A1 | 4/2014 | Gossler et al. |
| 2014/0138719 A1 | 5/2014 | Maindron et al. |
| 2015/0118544 A1 | 4/2015 | Oukassi |
| 2015/0144590 A1 | 5/2015 | Simonato et al. |
| 2015/0228873 A1 | 8/2015 | Gebuhr et al. |
| 2015/0280060 A1 | 10/2015 | Gilet et al. |
| 2015/0380461 A1 | 12/2015 | Robin et al. |
| 2016/0079565 A1 | 3/2016 | Maindron et al. |
| 2016/0190400 A1 | 6/2016 | Jung et al. |
| 2016/0218240 A1 | 7/2016 | Bouvier et al. |
| 2016/0293811 A1 | 10/2016 | Hussell et al. |
| 2016/0336483 A1 | 11/2016 | Shatalov et al. |
| 2017/0068362 A1 | 3/2017 | Boer et al. |
| 2017/0080457 A1 | 3/2017 | Eymery et al. |
| 2017/0098746 A1 | 4/2017 | Bergmann et al. |
| 2017/0137645 A1 | 5/2017 | Manceau et al. |
| 2017/0186612 A1 | 6/2017 | Almadori et al. |
| 2017/0243860 A1 | 8/2017 | Hong et al. |
| 2017/0293065 A1 | 10/2017 | Kim |
| 2017/0294418 A1 | 10/2017 | Edmond et al. |
| 2017/0309794 A1 | 10/2017 | Von Malm |
| 2017/0358563 A1 | 12/2017 | Cho et al. |
| 2017/0358724 A1 | 12/2017 | Shichijo et al. |
| 2018/0017939 A1 | 1/2018 | Allier et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0090540 A1 | 3/2018 | Von Malm et al. |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0198024 A1 * | 7/2018 | Lai ......................... H01L 33/14 |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1 | 9/2018 | Gmeinsieser et al. |
| 2018/0283642 A1 | 10/2018 | Liao et al. |
| 2018/0297510 A1 | 10/2018 | Fiederling et al. |
| 2018/0339643 A1 | 11/2018 | Kim |
| 2018/0339644 A1 | 11/2018 | Kim |
| 2018/0354406 A1 | 12/2018 | Park |
| 2020/0335484 A1 * | 10/2020 | Bono ..................... H01L 25/167 |
| 2022/0384395 A1 * | 12/2022 | Tan ....................... H01L 25/0753 |

FOREIGN PATENT DOCUMENTS

| | | |
|---|---|---|
| DE | 102014112551 A1 | 3/2016 |
| EP | 1378949 A1 | 1/2004 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2006921 B1 | 12/2018 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |

(56) References Cited

FOREIGN PATENT DOCUMENTS

| | | | |
|---|---|---|---|
| FR | 3052915 | A1 | 12/2017 |
| JP | 2016066765 | A | 4/2016 |
| KR | 20140118466 | A | 10/2014 |
| KR | 20170018687 | A | 2/2017 |
| KR | 20180010670 | A | 1/2018 |
| KR | 101888857 | B1 | 9/2018 |
| KR | 20180114413 | A | 10/2018 |
| TW | 201417339 | A | 5/2014 |
| TW | 201620163 | A | 6/2016 |
| WO | 2011045289 | A1 | 4/2011 |
| WO | 2011048318 | A1 | 4/2011 |
| WO | 2012035243 | A1 | 3/2012 |
| WO | 2012156620 | A2 | 11/2012 |
| WO | 2013182969 | A1 | 12/2013 |
| WO | 2015044620 | A1 | 4/2015 |
| WO | 2016079505 | A1 | 5/2016 |
| WO | 2017089676 | A1 | 6/2017 |
| WO | 2017102708 | A1 | 6/2017 |
| WO | WO2017184686 | A | 10/2017 |
| WO | 2017216445 | A1 | 12/2017 |
| WO | 2018091657 | A1 | 5/2018 |
| WO | 2018139866 | A1 | 8/2018 |
| WO | 2018143682 | A1 | 8/2018 |
| WO | 2018159977 | A1 | 9/2018 |
| WO | 2018169243 | A1 | 9/2018 |
| WO | 2019126539 | A | 6/2019 |

OTHER PUBLICATIONS

PCT International Search Report and Written Opinion in PCT/US2021/051652 dated Jan. 10, 2022, 14 pages.
Non-Final Office Action in U.S. Appl. No. 17/213,388, dated Apr. 6, 2023, 10 pages.

\* cited by examiner

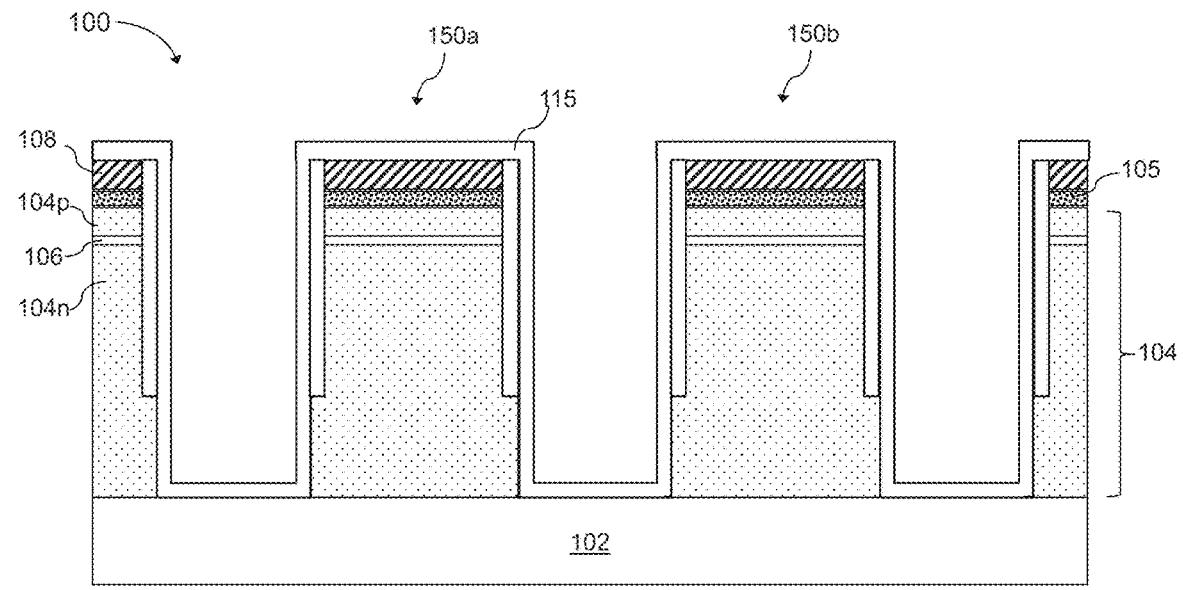
FIG. 1F.1
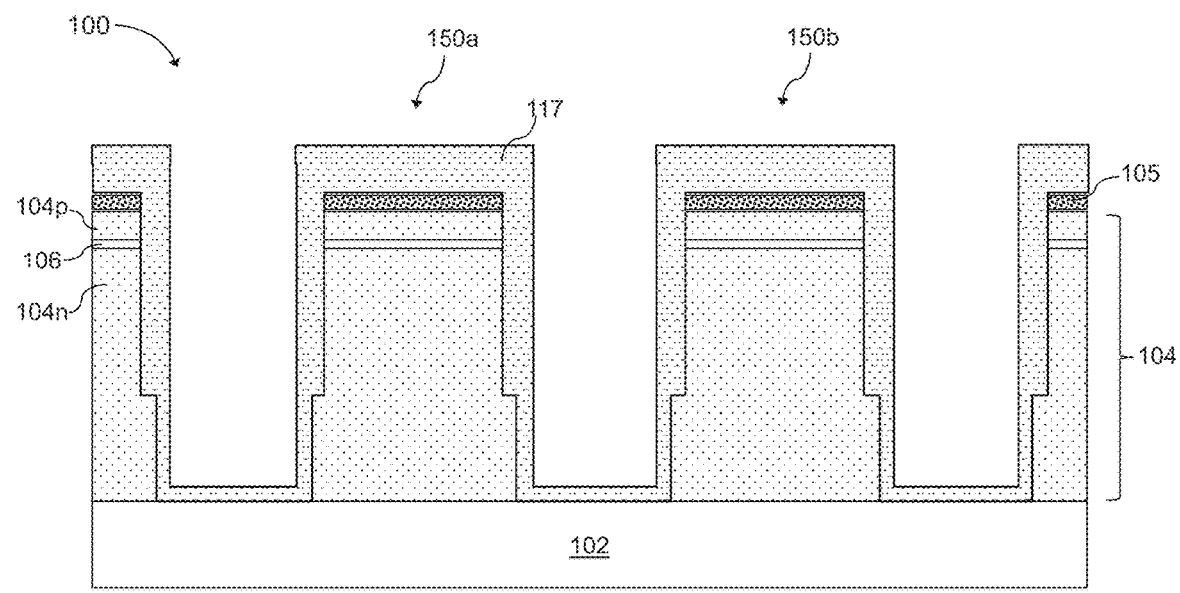
FIG. 1F.2

METHODS OF MAKING FLIP CHIP MICRO LIGHT EMITTING DIODES

CROSS-REFERENCE TO RELATED APPLICATIONS

This application claims priority to U.S. Provisional Application No. 63/119,745, filed Dec. 1, 2020, the entire disclosure of which is hereby incorporated by reference herein.

TECHNICAL FIELD

Embodiments of the disclosure generally relate to micro light emitting diode (micro-LED or uLED or µLED) devices and methods of manufacturing the same. More particularly, embodiments are directed to individual micro light emitting diode devices having a thin film flip-chip (TFFC) design that include a cathode contacting a first sidewall of an n-type layer and an anode contacting a top surface of a p-contact layer, the first sidewall of the n-type layer and the top surface of the p-contact layer being in two different planar orientations.

BACKGROUND

A light emitting diode (LED) is a semiconductor light source that emits visible light when current flows through it. LEDs combine a p-type semiconductor with an n-type semiconductor. LEDs commonly use a III-V group compound semiconductor. A III-V group compound semiconductor provides stable operation at a higher temperature than devices that use other semiconductors. The III-V group compound is typically formed on a substrate formed of sapphire aluminum oxide ($Al_2O_3$) or silicon carbide (SiC).

Various emerging display applications, including wearable devices, head-mounted, and large-area displays require miniaturized chips composed of arrays of micro-LEDs (µLEDs or uLEDs) with a high density having a lateral dimension down to less than 100 µm×100 µm. Micro-LEDs typically have dimensions of about 50 µm in diameter or width and smaller that are used in the manufacture of color displays by aligning in close proximity uLEDs comprising red, blue and green wavelengths. An approach to assemble displays constructed from individual dies is referred to as "pick-and-place" of individual LEDs. The pick-and-place (or pick and place) approach includes: picking up, aligning, and then attaching each individual blue, green and red wavelength micro-LED onto a backplane, followed by electrically connecting the backplane to a driver integrated circuit. Due to the small size of each micro-LED, this assembly sequence can be slow and subject to manufacturing errors. Furthermore, as the die size decreases to satisfy increasing resolution requirements of displays, larger and larger numbers of die must be transferred at each pick and place operation to populate a display of required dimensions.

Stand alone uLED pixels or devices used for pick-and-place assemblies fall broadly into 2 categories: thin film flip-chip (TFFC) or vertical thin film (VTF), each with its specific advantages and applications, along with limitations associated with their typical designs. While a TFFC design typically offers a lower forward voltage, higher current drive capability and therefore higher brightness and efficiency performance, a VTF design offers easier dimensional down-scaling for smaller and higher density micro-LED designs.

Due to the numerous numbers of stand alone micro-LED devices, it is a goal to make them reliably and efficiency, and that the micro-LED devices themselves are efficient. Making stand alone micro-LED pixels efficient facilitates utilizing their micron-sized spacing effectively for transmitting light. There is a further ongoing need to maximize light-emitting area while improving handling and processing of standalone micro-LEDs.

SUMMARY

Provided herein are light sources and methods of making them. A uLED having a thin film flip-chip (TFFC) design is advantageous in offering benefits of both thin film flip-chip (TFFC) and vertical thin film (VTF) architectures through a design that is dimensionally down-scalable while maximizing light-emitting area (LEA) of the epitaxy. The design also maximizes the light output extraction.

In an aspect, a micro-light emitting diode (uLED) device comprises: a mesa comprising: a plurality of semiconductor layers including an n-type layer, an active layer, and a p-type layer; a p-contact layer contacting the p-type layer; the mesa comprising a height spanning from a top surface of the p-contact layer to a bottom surface of the n-type layer and a width spanning a first sidewall of the n-type layer to a second sidewall of the n-type layer; the top surface of the p-contact layer having a different planar orientation compared to the first and second sidewalls of the n-type layer; a cathode contacting the first sidewall of the n-type layer; a first region of dielectric material that insulates the p-contact layer, the active layer, and a first sidewall of the p-type layer from the cathode; an anode contacting the top surface of the p-contact layer; and a second region of dielectric material that insulates the active layer, a second sidewall of the p-type layer, and the second sidewall of the n-type layer from the anode.

In another aspect, a display device comprises: a backplane; a plurality of individually-placed uLED devices attached to the backplane, each of the uLED devices comprising a uLED according any embodiments herein; and a housing including a display face enclosing the plurality of individually-placed uLED devices.

A further aspect includes a method of manufacturing a micro-light emitting diode (uLED) device comprising: depositing a plurality of semiconductor layers including an n-type layer, an active layer, and a p-type layer on a substrate; depositing a p-contact layer on the plurality of semiconductor layers; depositing a hard mask layer on the p-contact layer; etching a portion of the semiconductor layers, the p-contact layer, and the hard mask layer to form trenches and plurality of mesas, each of the mesas having a height spanning from a top surface of the p-contact layer to a bottom surface of the n-type layer and a width spanning a first sidewall of the n-type layer to a second sidewall of the n-type layer; depositing a dielectric metal over the substrate into the trenches and on an uppermost surface of the substrate; first etching to expose the p-contact layer and a first portion of a surface of the substrate; second etching to expose the n-type layer and a second portion of the surface of the substrate; depositing a first metal onto areas exposed by the first etching and the second etching; and etching to form a cathode and an anode which are isolated from each other; the foregoing steps forming a processed structure.

Another aspect is a method of making a display device comprising: attaching plurality of micro light emitting diodes (uLEDs) to a backplane by a pick-and-place method;

and enclosing the plurality of LEDs in a housing with a display face; each of the uLEDS comprising a uLED according embodiment herein.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements. The figures herein are not to scale.

FIGS. 1F.1 and 1F.2 illustrate cross-sectional views of the stack after a step in the manufacture of a LED device according to one or more embodiments;

DETAILED DESCRIPTION

Figure 1A:
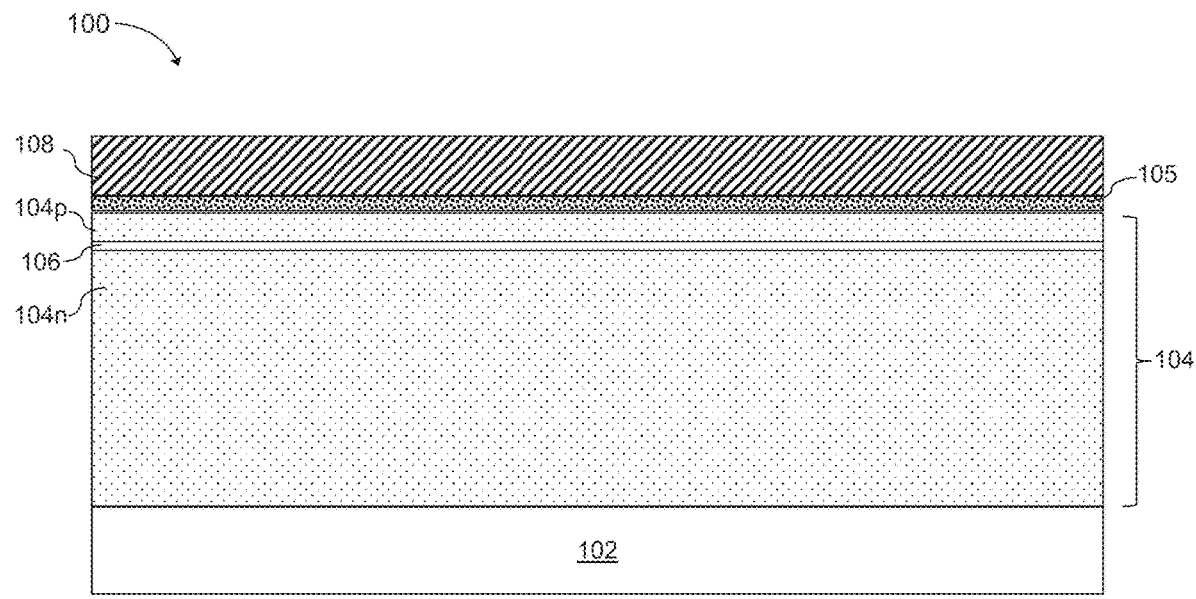
FIG. 1A illustrates a cross-sectional view of a stack of semiconductor layers, a metal layer (e.g., a p-contact layer or p-metal reflector layer), and a dielectric layer (e.g., a hard mask layer) deposited on a substrate according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and alloys), metal alloys, and other conductive materials, depending on the application. Substrates include, without limitation, light emitting diode (LED) devices, including uLED devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Reference to a micro-LED (uLED or μLED) means a light emitting diode having one or more characteristic dimensions (e.g., height, width, depth, thickness, etc. dimensions) of less than 100 micrometers. In one or embodiments, one or more dimensions of height, width, depth, thickness have values in a range of 2 to 25 micrometers.

Methods of depositing thin films include but are not limited to: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof.

Advantages of the uLEDs herein having a thin film flip-chip (TFFC) include but are not limited to: increased semiconductor (epi-layer) active area with increased p-contact reflector area; increased reflective sidewalls; and increased light extraction from light emitting surface. The uLEDs have a small footprint and efficient light extraction, which results in excellent utilization of space and materials when working on a micro-level and smaller. The uLEDs herein are suitable for the very high brightness requirements generally found in advanced automotive ADB, or high resolution high brightness displays. In addition, the uLEDs are also suitable for a wide variety of other flash, display, and illumination applications that currently use LEDs.

Figure 5:
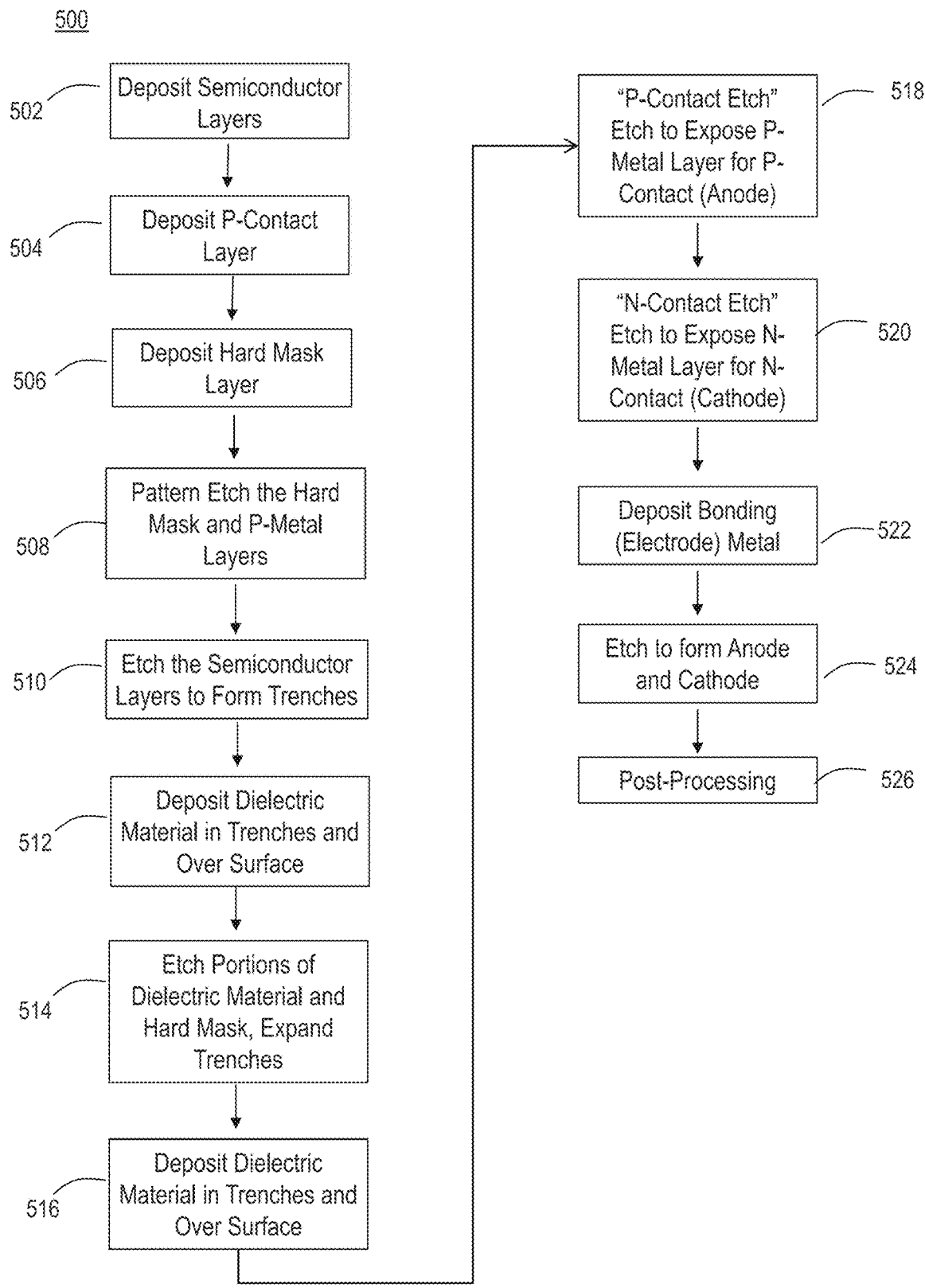
FIG. 5 provides an exemplary process flow diagram for manufacture of a uLED device.

Turning to the figures, FIGS. 1A-1J provide cross-sectional views of stack of layers as constructed and processed during manufacture of a uLED device. FIG. 5 provides an exemplary process flow diagram for manufacture of a uLED device.

FIG. 1A is cross-sectional view of a stack of semiconductor layers, a metal layer (e.g., a p-contact layer or p-metal reflector layer), and a dielectric layer (e.g., a hard mask layer) deposited on a substrate during a step in the manufacture of a uLED device according to one or more embodiments. With reference to FIG. 1A and to the flow diagram 500 of FIG. 5, semiconductor layers 104 are grown on a substrate 102 at operations 502, 504, and 506. The semiconductor layers 104 according to one or more embodiments comprise epitaxial layers, III-nitride layers or epitaxial III-nitride layers.

The substrate may be any substrate known to one of skill in the art. In one or more embodiments, the substrate comprises one or more of sapphire, silicon carbide, silicon (Si), quartz, magnesium oxide (MgO), zinc oxide (ZnO), spinel, and the like. In one or more embodiments, the substrate is not patterned prior to the growth of the epitaxial layer(s). Thus, in some embodiments, the substrate is not patterned and can be considered to be flat or substantially flat. In other embodiments, the substrate is patterned, e.g. patterned sapphire substrate (PSS).

In one or more embodiments, the semiconductor layers 104 comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers 104 comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. In one or more specific embodiments, the semiconductor layers 104 comprises a p-type layer, an active region, and an n-type layer.

In one or more embodiments, the substrate 102 is placed in a metalorganic vapor-phase epitaxy (MOVPE) reactor for epitaxy of LED device layers to grow the semiconductor layers 104.

In one or more embodiments, the semiconductor layers 104 comprise a stack of undoped III-nitride material and doped III-nitride material. The III-nitride materials may be doped with one or more of silicon (Si), oxygen (O), boron (B), phosphorus (P), germanium (Ge), manganese (Mn), or magnesium (Mg) depending upon whether p-type or n-type III-nitride material is needed. In specific embodiments, the semiconductor layers 104 comprise an n-type layer 104n, an active layer 106 and a p-type layer 104p.

In one or more embodiments, the semiconductor layers 104 have a thickness in a range of from about 2 µm to about 10 µm, including a range of from about 2 µm to about 9 µm, 2 µm to about 8 µm, 2 µm to about 7 µm, 2 µm to about 6 µm, 2 µm to about 5 µm, 2 µm to about 4 µm, 2 µm to about 3 µm, 3 µm to about 10 µm, 3 µm to about 9 µm, 3 µm to about 8 µm, 3 µm to about 7 µm, 3 µm to about 6 µm, 3 µm to about 5 µm, 3 µm to about 4 µm, 4 µm to about 10 µm, 4 µm to about 9 µm, 4 µm to about 8 µm, 4 µm to about 7 µm, 4 µm to about 6 µm, 4 µm to about 5 µm, 5 µm to about 10 µm, 5 µm to about 9 µm, 5 µm to about 8 µm, 5 µm to about 7 µm, 5 µm to about 6 µm, 6 µm to about 10 µm, 6 µm to about 9 µm, 6 µm to about 8 inn, 6 µm to about 7 µm, 7 µm to about 10 µm, 7 µm to about 9 µm, or 7 µm to about 8 µm.

In one or more embodiments, an active layer 106 is formed between the n-type layer 104n and the p-type layer 104p. The active layer 106 may comprise any appropriate materials known to one of skill in the art. In one or more embodiments, the active layer 106 is comprised of a III-nitride material multiple quantum wells (MQW), and a III-nitride electron blocking layer.

In one or more embodiments, a p-contact layer 105 and a hard mask layer 108 are deposited on the p-type layer 104p. As shown, the p-contact layer 105 is deposited on the p-type layer 104p and the hard mask layer 108 is on the p-contact layer 105. In some embodiments, the p-contact layer 105 is deposited directly on the p-type layer 104p. In other embodiments, not illustrated, there may be one or more additional layer between the p-type layer 104p and the p-contact layer 105. In some embodiments, the hard mask layer 108 is deposited directly on the p-contact layer 105. In other embodiments, not illustrated, there may be one or more additional layers between the hard mask layer 108 and the p-contact layer 105. The hard mask layer 108 and the p-contact layer 105 may be deposited by any appropriate technique known to the skilled artisan. In one or more embodiments, the hard mask layer 108 and p-contact layer 105 are deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

"Sputter deposition" as used herein refers to a physical vapor deposition (PVD) method of thin film deposition by sputtering. In sputter deposition, a material, e.g. a metal, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e. two or more reactive compounds, to deposit a layer of material on the substrate surface. When the substrate is exposed to the alternating precursors, the precursors are introduced sequentially or simultaneously.

The precursors are introduced into a reaction zone of a processing chamber, and the substrate, or portion of the substrate, is exposed separately to the precursors.

As used herein according to some embodiments, "chemical vapor deposition (CVD)" refers to a process in which films of materials are deposited from the vapor phase by decomposition of chemicals on a substrate surface. In CVD, a substrate surface is exposed to precursors and/or co-reagents simultaneous or substantially simultaneously. As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. A PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g. a thin film on a substrate. Similarly to a thermal ALD process, a purge step maybe conducted between the delivery of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

In one or more embodiments, the hard mask layer 108 may be fabricated using materials and patterning techniques which are known in the art. In some embodiments, the hard mask layer 108 comprises a metallic or a dielectric material or a photoresist material. Suitable dielectric materials include, but are not limited to, silicon oxide (SiO), silicon nitride (SiN), silicon carbide (SiC), aluminum oxide ($AlO_x$), aluminum nitride (AlN) and combinations thereof. The skilled artisan will recognize that the use of formulas like SiO, to represent silicon oxide, does not imply any particular stoichiometric relationship between the elements. The formula merely identifies the primary elements of the film.

In one or more embodiments, the p-contact layer 105 may comprise any suitable metal known to one of skill in the art. In one or more embodiments, the p-contact layer 105 comprises: aluminum (Al), titanium (Ti), platinum (Pt), silver (Ag), gold (Au), palladium (Pd), titanium-tungsten (TiW), or various combinations of these. In an embodiment, the p-contact layer 105 comprises silver (Ag). In one or more embodiments, the p-contact layer 105 is reflective.

The p-contact layer has a property of forming ohmic contact with the p-layer 104*p* (e.g., p-GaN). Embodiments include the p-metal having adequately reflective properties for a device's specific application, as well as providing an etch stop during the p-contact etch. In one or more embodiments, the p-contact layer is deposited through either an evaporation or sputtering process, or a combination of both.

In one or more embodiments, the p-contact layer comprises a thickness range of less than or equal to 1.5 micrometers.

As a non-limiting example, at operations 502, 504, and 506, manufacture of a uLED device starts with deposition of a p-metal on a gallium nitride (GaN) semiconductor (p-side up) that is grown on a sapphire wafer substrate. This is followed by a dielectric hardmask deposition with a thickness of approximately 0.5× semiconductor layers (epi layers) thickness.

Figure 1B:
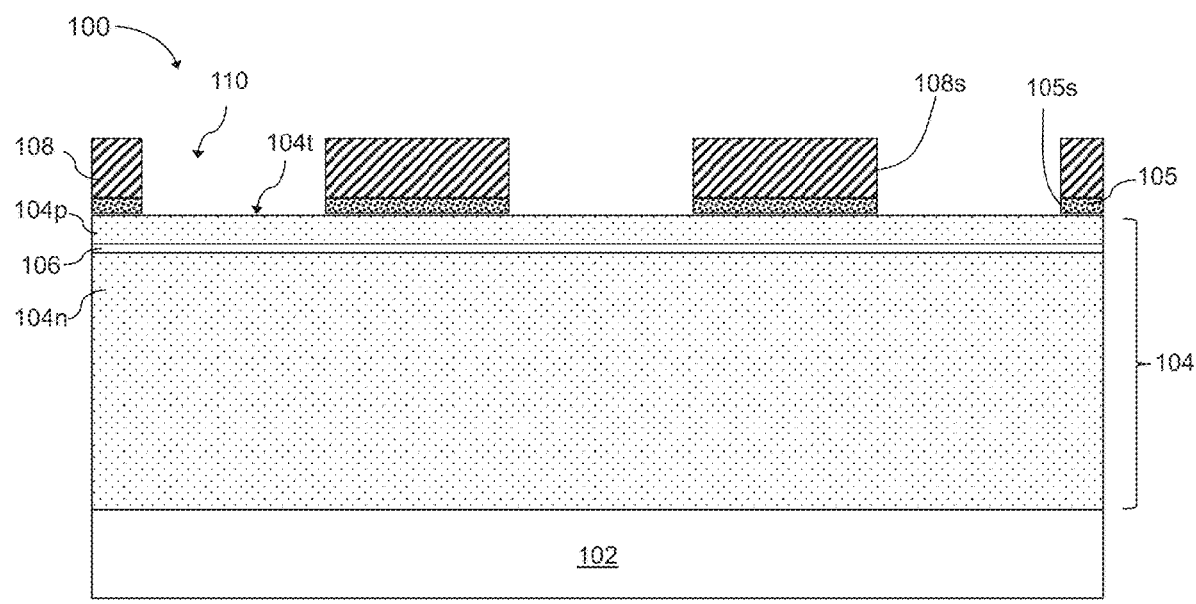
FIG. 1B illustrates a cross-sectional view of the stack after a step in the manufacture of a LED device according to one or more embodiments.

FIG. 1B is cross-sectional view of the stack after a step in the manufacture of a LED device 100 according to one or more embodiments. With reference to FIG. 1B and FIG. 5, the hard mask layer 108 and p-contact layer 105 are patterned at operation 508 to form at least one opening 110 in the hard mask layer 108 and p-contact layer 105, exposing a top surface 104*t* of the semiconductor layers 104 and sidewalls 108*s*, 105*s* of the hard mask layer 108 and p-contact layer 105.

In one or more embodiments, the hard mask layer 108 and p-contact layer 105 are patterned according to any appropriate patterning technique known to one of skill in the art. In one or more embodiments, the hard mask layer 108 and p-contact layer 105 are patterned by etching. According to one or more embodiments, conventional masking, wet etching and/or dry etching processes can be used to pattern the hard mask layer 108 and the p-contact layer 105.

In other embodiments, a pattern is transferred to the hard mask layer 108 and p-contact layer 105 using nanoimprint lithography. In one or more embodiments, the substrate 102 is etched in a reactive ion etching (RIE) tool using conditions that etch the hard mask layer 108 and p-contact layer 105 efficiently but etch the p-type layer 104*p* very slowly or not at all. In other words, the etching is selective to the hard mask layer 108 and p-contact layer 105 over the p-type layer 104*p*. In a patterning step, it is understood that masking techniques may be used to achieve a desired pattern.

As a non-limiting example, at operations 508, manufacture of the uLED device comprises applying a mask, for example, a photomask to pattern the hard-mask. This is followed by an anisotropic etch of the hardmask and photoresist removal; and thereafter an anisotropic etch of the p-metal.

Figure 1C:
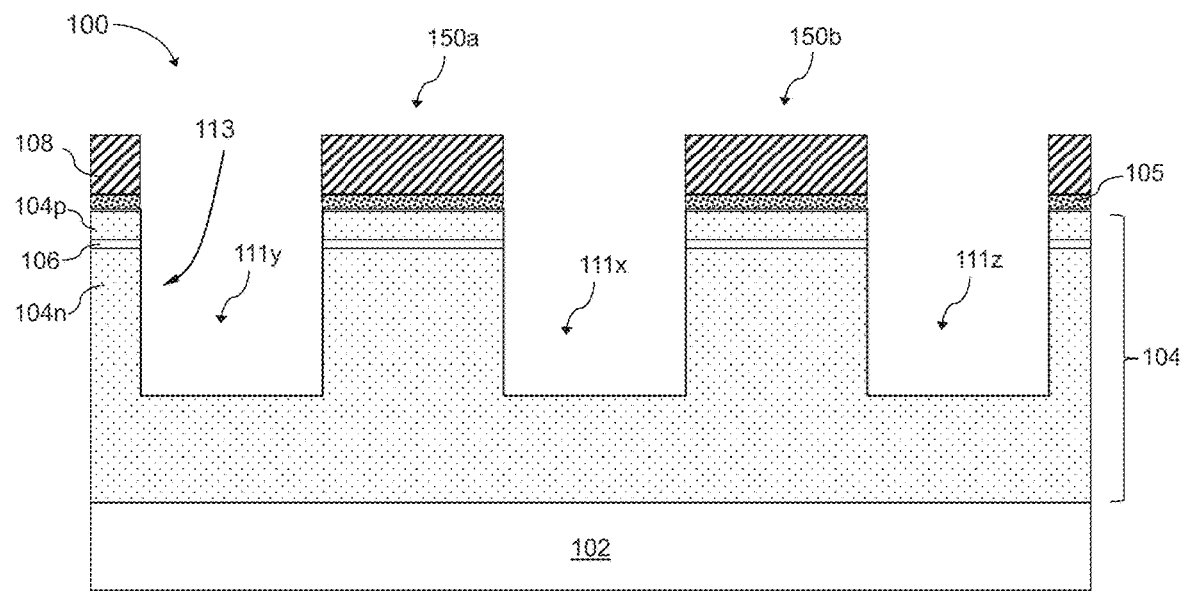
FIG. 1C illustrates a cross-sectional view of the stack after a step in the manufacture of a LED device according to one or more embodiments.

FIG. 1C is cross-sectional view of the stack after a step in the manufacture of a LED device 100 according to one or more embodiments. With reference to FIG. 1C and FIG. 5, the semiconductor layers 104 are etched to form at least one mesa at operation 510, for example a first mesa 150*a* and a second mesa 150*b*. In one or more embodiments, the mesas will undergo processing to include other features or constructions. In the embodiment illustrated in FIG. 1C, the first mesa 150*a* and the second mesa 150*b* are separated by a trench 111*x*. There is a trench lily on the other side of mesa 150*a* and a trench 111*z* on the other side of mesa 150*b*. Generally, each trench which will be referred to as a trench 111. Each trench 111 has sidewalls 113.

With respect to etching, according to one or more embodiments, highly anisotropic etch methods are used to achieve angles ranging from vertical (90 degrees) to 80 degrees to even smaller values, and all values therebetween. The depth of the mesa/junction etch will typically not exceed 5 micrometers. In one or more embodiments, an anisotropic etch of the mesa is used to form trenches.

Figure 1D:
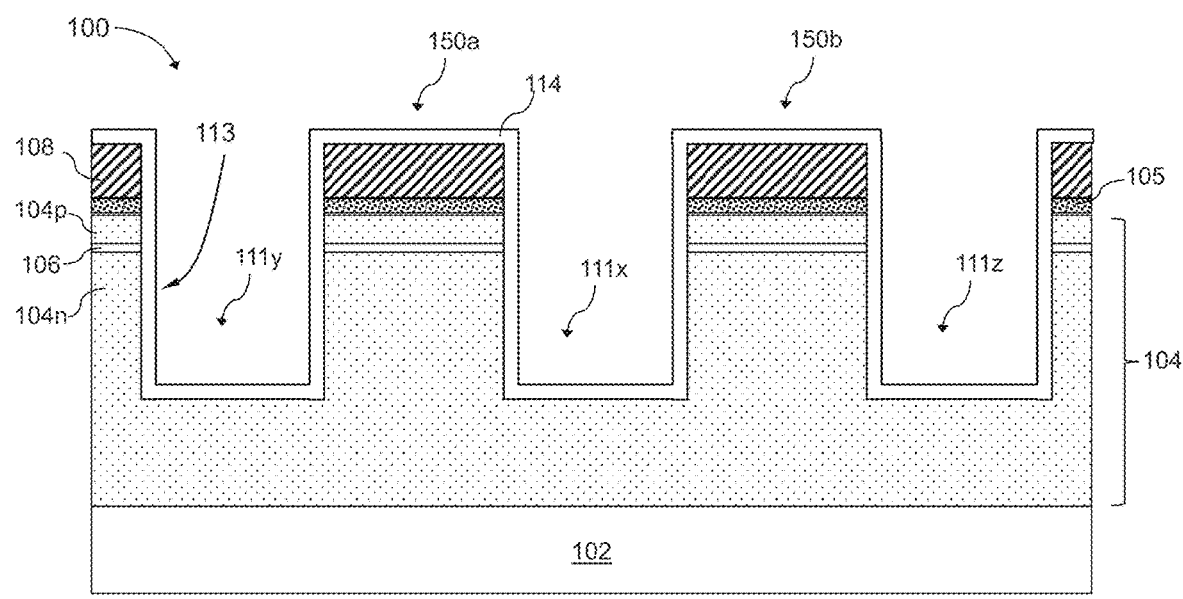
FIG. 1D illustrates a cross-sectional view of the stack after a step in the manufacture of a LED device according to one or more embodiments.

FIG. 1D is cross-sectional view of the stack after a step in the manufacture of a LED device 100 according to one or more embodiments. With reference to FIG. 1D and FIG. 5, a conformal layer of material is deposited at operation 512 to form junction spacers 114 on tops of the mesas and the sidewalls and bottoms of the trenches 111. The junction spacers 114 may comprise any appropriate material known to one of skill in the art. In one or more embodiments, the junction spacers 114 comprise a dielectric material.

As used herein, the term "dielectric" refers to an electrical insulator material that can be polarized by an applied electric field. In one or more embodiments, the junction spacers 114 may be oxides, e.g., silicon oxide ($SiO_2$), aluminum oxide ($Al_2O_3$), nitrides, e.g., silicon nitride ($Si_3N_4$), and combinations e.g., silicon oxynitride (SiON). In one or more embodiments, the junction spacer 114 comprises silicon nitride ($Si_3N_4$). In other embodiments, the junction spacer 114 comprises silicon oxide ($SiO_2$). In some embodiments, the junction spacer 114 composition is non-stoichiometric relative to the ideal molecular formula. In one or more embodiments, the junction spacer 114 comprises: $SiO_2$, SiN, SiON, $Al_2O_3$, or various combination of these. Junction spacers may provide properties of low light absorption and suitable refractive index contrast at the film interfaces for combination films.

In some embodiments, the junction spacers 114 may be a distributed Bragg reflector (DBR). As used herein, a "distributed Bragg reflector" refers to a structure (e.g. a mirror) formed from a multilayer stack of alternating thin film materials with varying refractive index, for example high-index and low-index films.

In one or more embodiments, the junction spacers 114 are deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD). The remaining thickness on the sidewall will typically not exceed 1.5 micrometers.

In one or more embodiments, the junction spacers are bi- or multi-layered. In one or more embodiments, the a first layer has a higher refractive index (RI) (e.g., $Al_2O_3$ has a RI of 1.8) than a second layer (e.g., $SiO_2$ has a RI of 1.4), which provides excellent reflection properties for photons impinging on the mesa sidewall.

In one or more embodiments, the junction spacers 114 have a thickness in a range of from about 200 nm to about 1 μm, for example, about 300 nm to about 1 μm, about 400 nm to about 1 μm, about 500 nm to about 1 μm, about 600 nm to about 1 μm, about 700 nm to about 1 μm, about 800 nm to about 1 μm, about 500 nm to about 1 μm, about 200 nm to about 900 nm, 300 nm to about 900 nm, about 400 nm to about 900 nm, about 500 nm to about 900 nm, about 600 nm to about 900 nm, about 700 nm to about 900 nm, about 800 nm to about 900 nm, about 200 nm to about 800 nm, 300 nm to about 800 nm, about 400 nm to about 800 nm, about 500 nm to about 800 nm, about 600 nm to about 800 nm, about 700 nm to about 800 nm, about 200 nm to about 700 nm, about 300 nm to about 700 nm, about 400 nm to about 700 nm, about 500 nm to about 700 nm, about 600 nm to about 700 nm, about 200 nm to about 600 nm, about 300 nm to about 600 nm, about 400 nm to about 600 nm, about 500 nm to about 600 nm, about 200 nm to about 500 nm, about 300 nm to about 500 nm, about 300 nm to about 400 nm, about 200 nm to about 400 nm, or about 300 nm to about 400 nm.

Figure 1E:
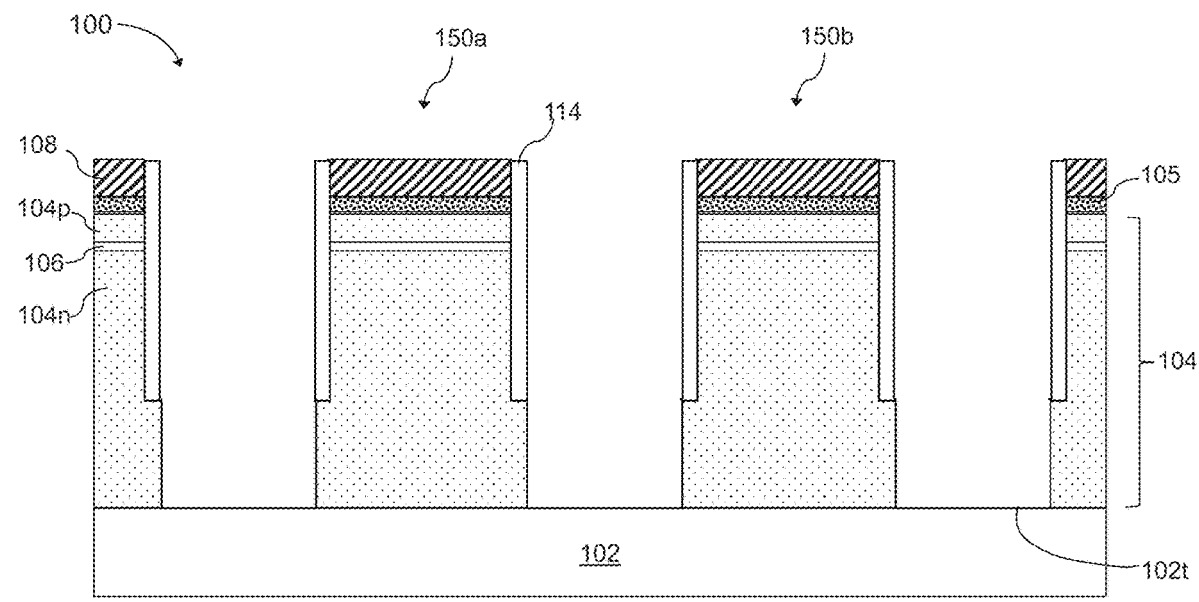
FIG. 1E illustrates a cross-sectional view of the stack after a step in the manufacture of a LED device according to one or more embodiments.

FIG. 1E is cross-sectional view of the stack after a step in the manufacture of a LED device 100 according to one or more embodiments. With reference to FIG. 1E and FIG. 5, further etching is conducted at operation 514. Horizontal portions of the junction spacers are etched from the bottom of the trenches and the tops of the hard masks. Some portions of the hard masks 108 are also etched. The semiconductor layers 104 are also etched and the trenches 111 are expanded (i.e. the depth of the trenches is increased) to expose a top surface 102t of the substrate 102. In one or more embodiments, the etching is selective such that the junction spacers 114 remain on the sidewalls of the trenches 111. In one or more embodiments, the trench 111 has a bottom 111b and sidewalls 113. In one or more embodiments, the trench 111 having a depth from a top surface 104t of the semiconductor layer forming the mesas in a range of from about 0.5 μm to about 2 μm. In one or more embodiments, highly anisotropic etch methods are used to achieve angles ranging from vertical (90 degrees) to 80 degrees, and all values therebetween. In one or more embodiments, an anisotropic etch is used to deepen the trenches and/or further shape the device.

With reference to FIGS. 1C-1E, the method includes self-alignment steps in that an edge of the dielectric layer 114 aligns with an edge of the n-layer 104n. In so doing, internal quantum efficiency is achieved to with respect to the semiconductor layers in that p-layer 104p, active layer 106 and n-layer 104n, which remain aligned and there is not a need in the final device to spread current laterally in the semiconductor, which would result in efficiency loss.

FIGS. 1F.1 and 1F.2 are cross-sectional views of the stack after a step in the manufacture of a LED device 100 according to one or more embodiments. With reference to FIG. 5, at operation 516, dielectric material is deposited again. With reference to FIG. 1F.1, a conformal layer of material is deposited to form trench spacers 115 on tops of the mesas and the sidewalls and bottoms of the trenches 111. The trench spacers 115 may comprise any appropriate material known to one of skill in the art. In one or more embodiments, the trench spacers 115 comprise a dielectric material as discussed with respect to junction spacers 114. With reference to FIG. 1F.2, the various dielectric materials of the hard mask layer 108, the junction spacers 114, and the trench spacers 115 of FIG. 1F.1 are combined to denote a combined dielectric region 117. In one or more embodiments, the combined dielectric region 117 comprises a plurality of different dielectric materials. In one or more alternative embodiments, the combined dielectric region 117 comprises a single dielectric material.

Figure 1G:
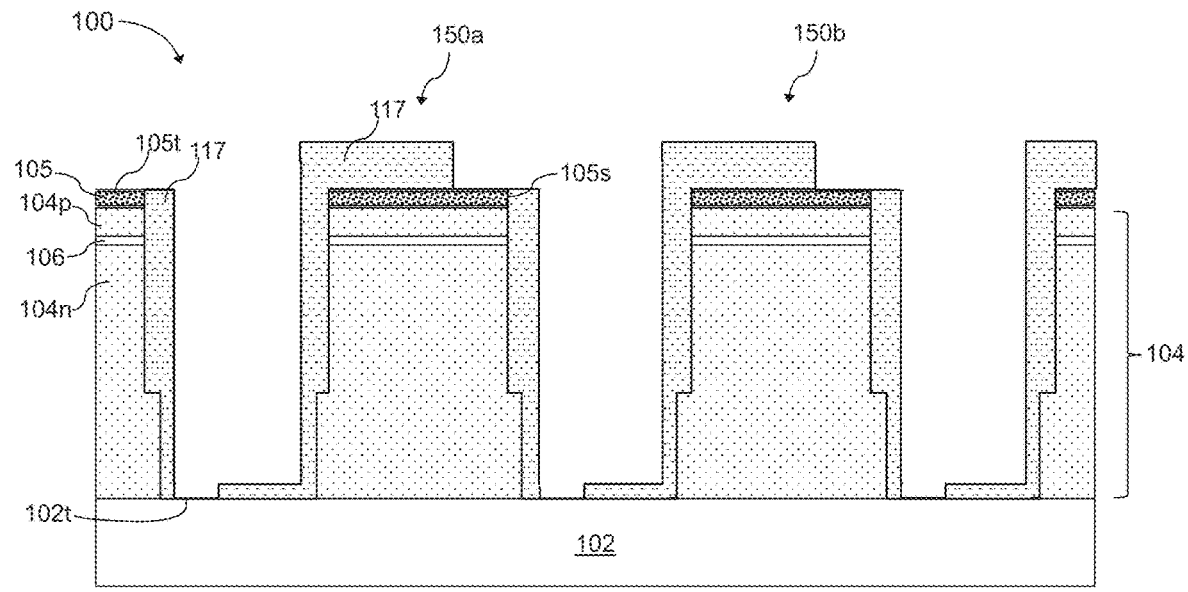
FIG. 1G illustrates a cross-sectional view of the stack after a step in the manufacture of a LED device according to one or more embodiments.

FIG. 1G is a cross-sectional view of the stack after a step in the manufacture of a LED device 100 according to one or more embodiments. With reference to FIG. 1G and FIG. 5, an etch procedure, referred to as a "p-contact etch," is conducted at operation 518 to expose portions of a top surface of the p-contact layer 105t and the top surface 102t of the substrate, at least. In one or more embodiments, a portion of a side surface of the p-contact layer 105s, which is in a different planar orientation as the top surface, is exposed.

In one or more embodiments, the substrate is masked prior to the a "p-contact etch," and the mask is thereafter removed.

In one or more embodiments, the p-contact etch is an anisotropic etch of the dielectric with high selectivity (>10:1) to the p-metal; it partially exposes the P-metal as shown with sufficient area for subsequent contact to an electrode metal. Slight over-etching may be expected exposing a little of the sidewall during this etch, but does not interfere with the electrode metal deposition in a later step.

Figure 1H:
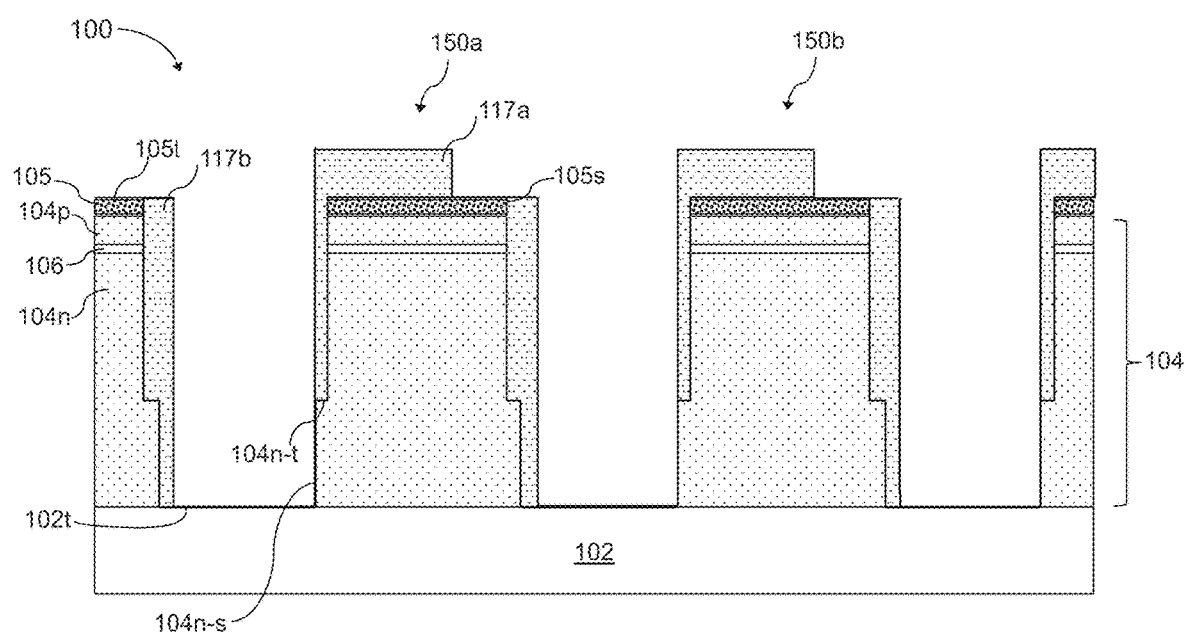
FIG. 1H illustrates a cross-sectional view of the stack after a step in the manufacture of a LED device according to one or more embodiments.

FIG. 1H is a cross-sectional view of the stack after a step in the manufacture of a LED device 100 according to one or more embodiments. With reference to FIG. 1H and FIG. 5, an etch procedure, referred to as a "n-contact etch," is conducted at operation 520 to expose a first side wall of the n-layer 104*n-s* and portions of the top surface 102*t* of the substrate, at least. In one or more embodiments, a portion of a side surface of the p-contact layer, which is in a different planar orientation as the top surface, is exposed.

In one or more embodiments, the substrate is masked prior to the a "p-contact etch," and the mask is thereafter removed.

In some embodiments, masking for the "n-contact etch" and the "p-contact etch" is conducted in the same step, and the subsequent mask removal is conducted in the same step.

In one or more embodiments, the n-contact etch is an isotropic etch of the trench spacer dielectric to expose the n-layer sidewall (e.g., N-GaN), for the formation of the n-contact in the next step. To ensure a suitable or timely etch stop for this lateral etching into the semiconductor layers (epi), and using the earlier example of an $Al_2O_3$—$SiO_2$ bilayer, a lateral etching of, say, a $SiO_2$ trench oxide over-etching (to ensure clearance) into the junction spacer will ultimately stop safely on the $Al_2O_3$.

Photoresist removal chemistry and process will be selected based on its compatibility with/selectivity to the exposed dielectric, metals, and semiconductor layers (epi).

Figure 1I:
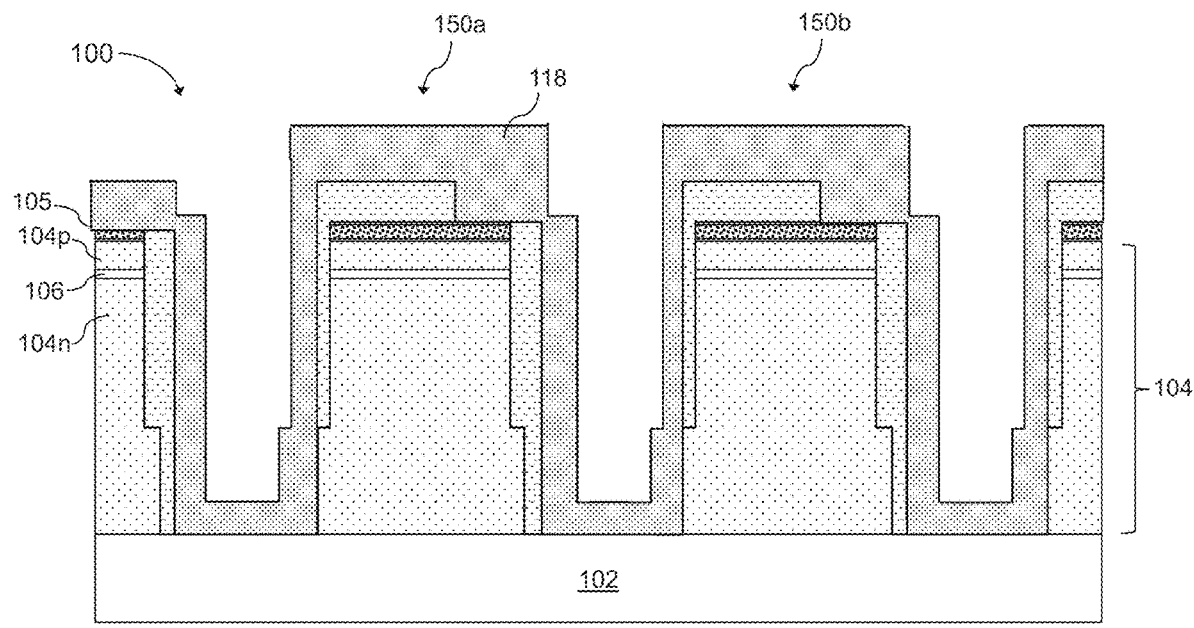
FIG. 1I illustrates a cross-sectional view of the stack after a step in the manufacture of a LED device according to one or more embodiments.

FIG. 1I is a cross-sectional view of the stack after a step in the manufacture of a LED device 100 according to one or more embodiments. With reference to FIG. 1I and FIG. 5, an electrode metal 118 for a p-contact (anode) an n-contact (cathode) is deposited at operation 522. In one or more embodiments, the operation 522 to deposit the electrode metal is a blanket conformal deposition. The electrode metal can also be referred to as a bonding metal. In one or more embodiments, the bonding metal 118 comprises: aluminum (Al), titanium (Ti), platinum (Pt), silver (Ag), gold (Au), palladium (Pd), or various combinations of these.

The bonding metal has a property of forming ohmic contact with the n-layer (e.g., N-GaN) and p-contact layer/p-metal reflective layer having adequately reflective properties for a device's specific application. In one or more embodiments, the bonding metal is deposited through either an evaporation, sputtering or electroplating process, or a combination of these. The thickness range of the bonding metal can range from less than or equal to 1 micrometer to several microns.

In one or more embodiments, the electrode metal is provided as a patterned bonding layer. In an embodiment, the patterned bonding layer is prepared by: application of photoresist, deposition of metal for the bonding layer, liftoff of any excess metal and photoresist. In an embodiment, the patterned bonding layer is prepared by: deposition of metal for the bonding layer, application of photoresist, ion beam etching, and photoresist removal. In an embodiment, the patterned bonding layer is prepared by: deposition of a seed metal deposition; application of photoresist; metal plating; photoresist removal; and seed etch.

Figure 1J:
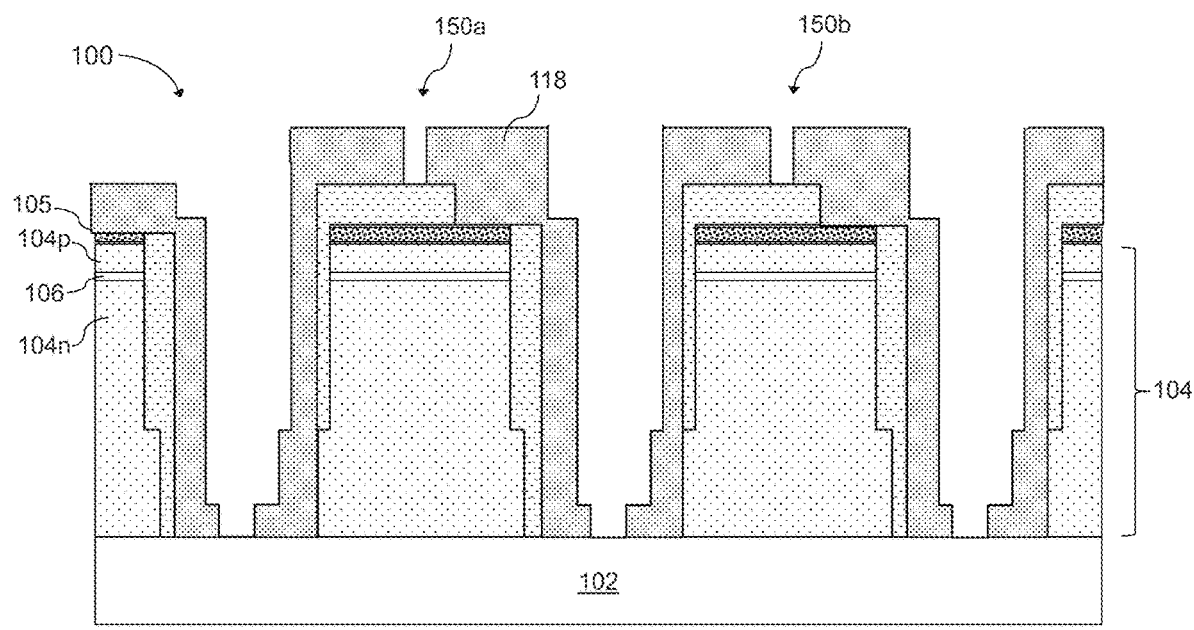
FIG. 1J illustrates a cross-sectional view of the stack after a step in the manufacture of a LED device according to one or more embodiments.

FIG. 1J is a cross-sectional view of the stack after a step in the manufacture of a LED device 100 according to one or more embodiments. With reference to FIG. 1J and FIG. 5, the metal 118 is etched at operation 524, thereby creating n-contact (cathode) 119 and p-contact (anode) 125. The cathode and anode are isolated from each other.

At this point, a processed structure is completed, ready to be post-processed.

Thereafter at operation 526, the resulting structure is post-processed for further use. In one or more embodiments, further processing including formation of a passivation layer around a portion or the entirety of the uLED. In one or more embodiments, the processed structure retains the substrate, is singulated, and is further processed as exemplified in FIGS. 2A-2C. In one or more embodiments, the processed structure is flipped and affixed to a support, for example, a tape support, and the substrate is removed, as exemplified in FIGS. 3A-3B. Removal of the substrate is in accordance with methods known in the art including substrate laser liftoff. Upon removal of the substrate, singulated uLEDs are created.

Further processing can include deposition of a downconverter material, e.g. layers of a phosphor material.

Figure 2A:
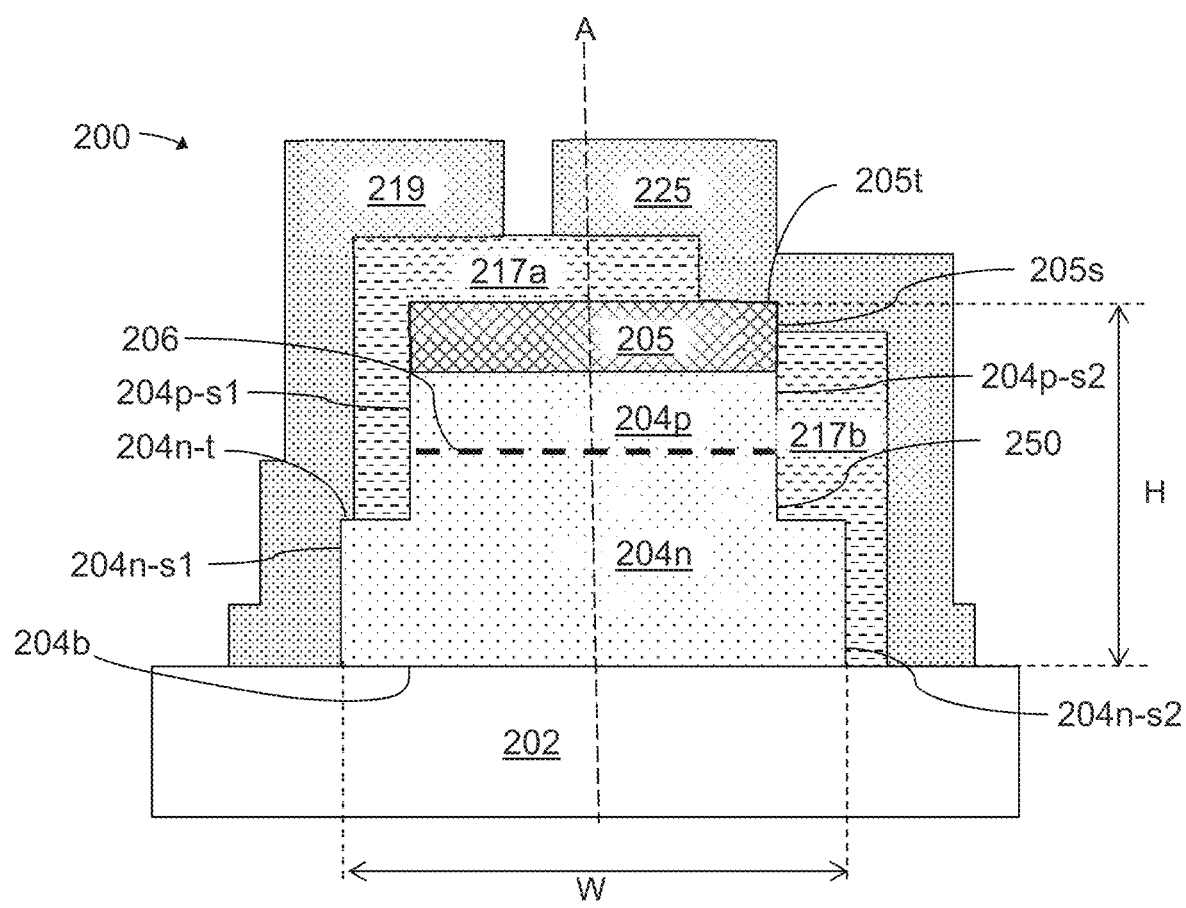
FIG. 2A illustrates a cross-sectional view of a singulated uLED device on a substrate according to one or more embodiments.
Figure 2B:
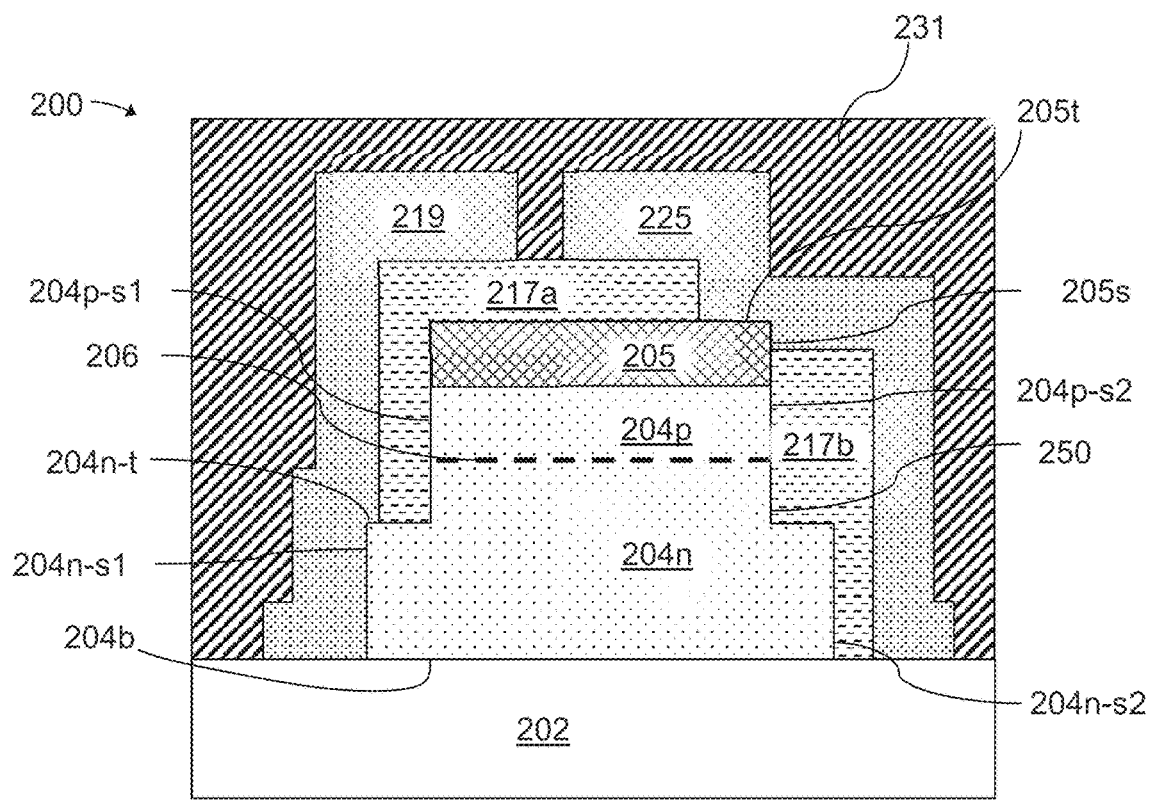
FIG. 2B illustrates a cross-sectional view of a singulated uLED device on a substrate according to one or more embodiments after a passivation layer has been deposited onto the uLED device of FIG. 2A.
Figure 2C:
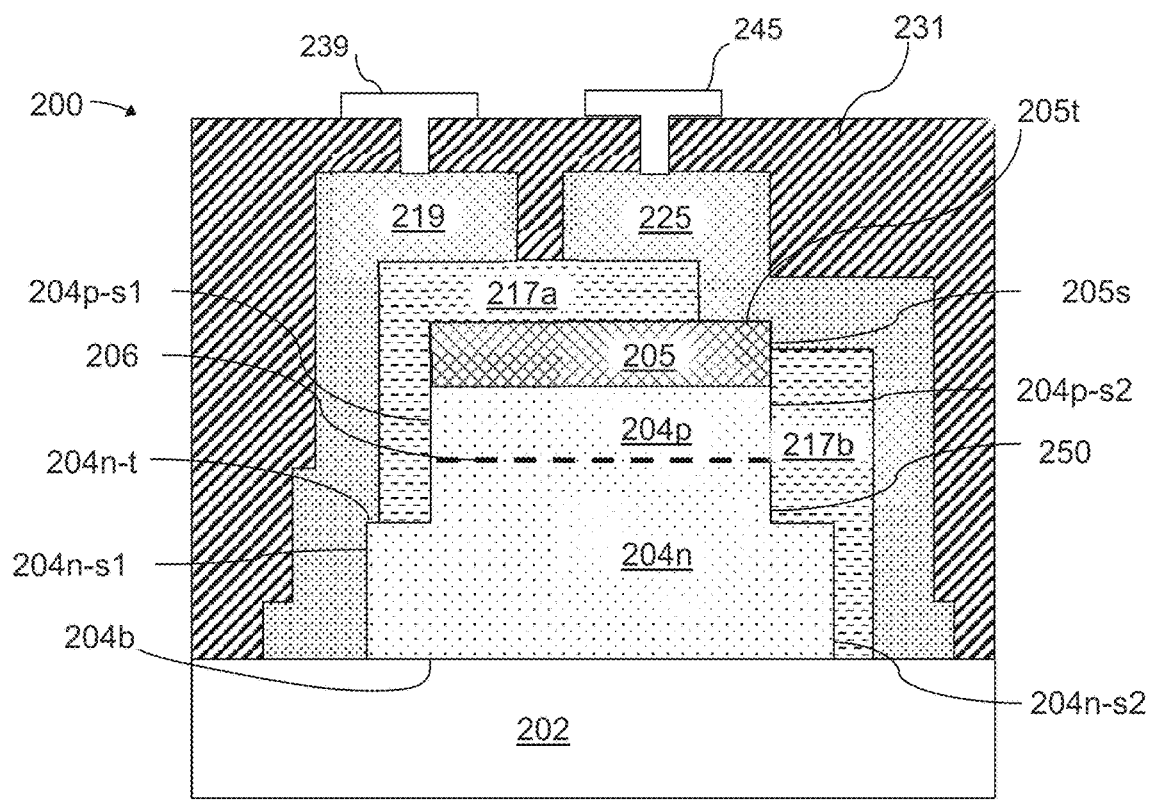
FIG. 2C illustrates a cross-sectional view of a singulated uLED device on a substrate according to one or more embodiments after the uLED device of FIG. 2C has been further processed.

FIG. 2A is a cross-sectional view of a singulated uLED device 200 on a substrate 202 according to embodiments made in accordance with FIGS. 1A-J and FIG. 5. FIGS. 2B-2C are cross-sectional views of the uLED device on a substrate of FIG. 2A after post-processing according to operation 526 of FIG. 5. In FIGS. 2A-2C, a mesa 250 comprises a plurality of semiconductor layers including an n-type layer 204*n*, an active layer 206, and a p-type layer 204*p*. A p-contact layer 205 contacts the p-type layer 204*p*. In this embodiment, there is direct contact between the p-contact layer 205 and the p-type layer 204*p*. Other embodiments may include intervening layers. As shown in FIG. 2A, and also applicable to FIGS. 2B-2C, the mesa comprises a height ("H") spanning from a top surface of the p-contact layer 205*t* to a bottom surface of the n-type layer 204*b* and a width ("W") spanning a first sidewall of the n-type layer 204*n-s*1 to a second sidewall of the n-type layer 204*n-s*2; the top surface of the p-contact layer 205*t* having a different planar orientation compared to the first sidewall 204*n-s*1 and the second sidewall 204*n-s*1 of the n-type layer 204*n*. In FIGS. 2A-2C, a cathode 219 contacts the first sidewall of the n-type layer 204*n-s*1. In this embodiment, the cathode 219 also contacts the p-layer on another surface 204*n-t* which is in a different planar orientation compared to the first sidewall of the n-type layer 204*n-s*1. A first region of dielectric material 217*a* insulates the p-contact layer 204*p*, the active layer 206, and a first sidewall of the p-type layer 204*p-s*1 from the cathode 219. An anode 325 contacts the top surface of the p-contact layer 205*t*. In this embodiment, the anode 225 also contacts the p-contact layer on another surface 205*s* which is in a different planar orientation compared to the top surface of the p-contact layer 205*t*. A second region of dielectric material 217*b* insulates the active layer 206, a second sidewall of the p-type layer 204*ps-*2, and the second sidewall of the n-type layer 204*n-s*2 from the anode 225.

As shown in FIGS. 2A-2C, the planar orientation of the first sidewall of the n-type layer 204*n-s*1 is different from that of the top surface of the p-contact layer 205*t*.

In FIG. 2B, a passivation layer 231 is deposited onto the structure of FIG. 2A, which is planarized according to one or more embodiments. In other embodiments, the passivation layer could be deposited conformally to the topography of the features below. In this way, the uLED of FIG. 2B can be further handled, transported, processed, incorporated into final displays or apparatuses, and the like, while the anode and cathode and other features are protected.

In FIG. 2C, upon additional lithography and etching of FIG. 2B, a portion of the passivation layer 231 is removed, and pads 239 and 245 are deposited to provide access to the cathode 219 and the anode 225. In this way, the uLED of FIG. 2C (and a plurality or array of the same) can be incorporated into final displays or apparatuses, and the like.

In one or more embodiments, the width of the mesa is less than 100 micrometers. In one or more embodiments, the height of the mesa is less than or equal to the width of the mesa.

As shown in FIG. 2A, and applicable to FIGS. 2B-2C, the cathode and the anode both longitudinally span the uLED device in that with reference to an axial line "A" of the uLED excluding the substrate, the anode and the cathode extend the entire axial distance.

Advantageously, the cathode wraps around a portion of the n-type layer 204n-s1 and a first portion of the first region of the dielectric material 217a. Likewise, the anode wraps around portions of the p-contact layer 205 and the second region of the dielectric material 217b. In this way, there is an increased presence of reflective sidewalls.

Further, embodiments herein advantageously include increased semiconductor (epi-layer) active area with increased p-contact reflector area. To facilitate efficient light extraction and increased light extraction from light emitting surface, in one or more embodiments, the p-contact layer contacting the p-type layer substantially spans a width of the p-type layer. For example, the p-contact layer contacting the p-type layer substantially may span greater than or equal to 75% to 100% of the width of the p-type layer, including greater than or equal to 80%, greater than or equal to 90%, greater than or equal to 95%, greater than or equal to 99%, greater than or equal to 99.5%, greater than or equal to 99.9%, to less than or equal to 100% of the width.

To facilitate efficient light extraction and increased light extraction from light emitting surface, in one or more embodiments, the p-type layer substantially spans a width of the active layer. For example, the p-type layer contacting the active layer substantially may span greater than or equal to 75% to 100% of the width of the active layer, including greater than or equal to 80%, greater than or equal to 90%, greater than or equal to 95%, greater than or equal to 99%, greater than or equal to 99.5%, greater than or equal to 99.9%, to less than or equal to 100% of the width.

To facilitate efficient light extraction and increased light extraction from light emitting surface, in one or more embodiments, widths of the p-contact layer, the p-layer, and the active layer are ±10% of each other, including ±5% of each other and ±1% of each other.

In one or more embodiments, the cathode contacts two planar orientations of the n-type layer.

In one or more embodiments, the anode contacts two planar orientations of the p-contact layer.

In one or more embodiments, the semiconductor layers have a total thickness in a range of from 2 μm to 10 μm.

In one or more embodiments, the n-type layer comprises N-GaN and the p-type layer comprises P-GaN.

Figure 3A:
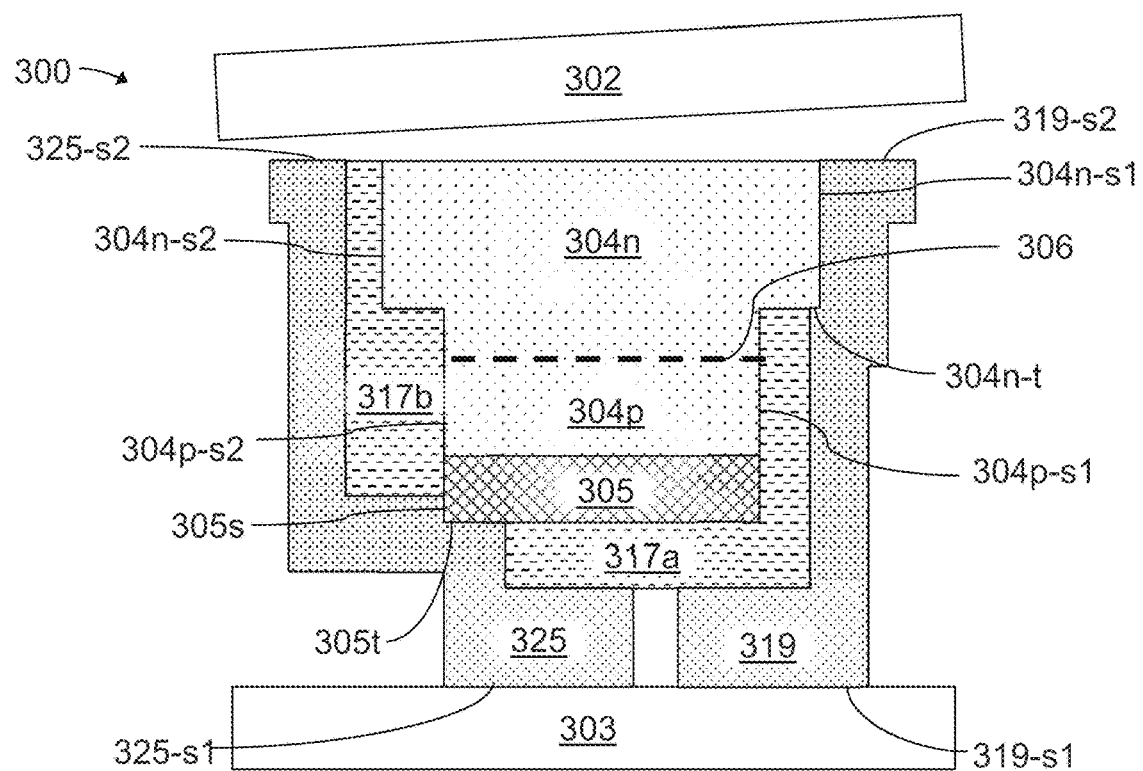
FIG. 3A illustrates a cross-sectional view of a singulated uLED device according to one or more embodiments denoting substrate liftoff of the substrate after the anode and the cathode are bonded to a support.

In one or more embodiments, the dielectric material of the first region and of the second region independently each comprise a material selected from the group consisting of $SiO_2$, $AlO_x$, and SiN, each independently has a thickness in a range of from 200 nm to 1 μm FIG. 3A is a cross-sectional view of a singulated uLED device 300 according to one or more embodiments herein denoting substrate liftoff of the substrate after the anode and the cathode are bonded to a support. In FIG. 3A, a mesa comprises a plurality of semiconductor layers including an n-type layer 304n, an active layer 306, and a p-type layer 304p. A p-contact layer 305 contacts the p-type layer 304p. In this embodiment, there is direct contact between the p-contact layer 305 and the p-type layer 304p. A cathode 319 contacts the first sidewall of the n-type layer 304n-s1. In this embodiment, the cathode 319 also contacts the n-layer on another surface 304n-t which is in a different planar orientation compared to the first sidewall of the n-type layer 304n-s1. A first region of dielectric material 317a insulates the p-contact layer 304p, the active layer 306, and a first sidewall of the p-type layer 304p-s1 from the cathode 319. An anode 325 contacts the top surface of the p-contact layer 305t. In this embodiment, the anode 325 also contacts the p-contact layer on another surface 305s which is in a different planar orientation compared to the top surface of the p-contact layer 305t. A second region of dielectric material 317b insulates the active layer 306, a second sidewall of the p-type layer 304ps-2, and the second sidewall of the n-type layer 304n-s2 from the anode 325.

In this embodiment, a device analogous to FIG. 2A is flipped over. Bonding surfaces of the cathode 319 and the anode 325 are affixed to a support 303. The substrate 302 is thereafter removed by methods known in the art such as substrate laser liftoff.

In FIG. 3A, a first longitudinal surface of the cathode 319-s1 defines a first bonding surface of the uLED and a first longitudinal surface of the anode 325-s1 defines a second bonding surface of the uLED, the first longitudinal surface of the cathode and the first longitudinal surface of the anode being located on a same side of the p-contact layer 305.

A second longitudinal surface of the cathode 319-s2 defines a first liftoff edge of the uLED and a second longitudinal surface of the anode 325-s2 defines a second liftoff edge of the uLED, the second longitudinal surface of the cathode and the second longitudinal surface of the anode being located on opposite sides of the n-type layer 304n.

Figure 3B:
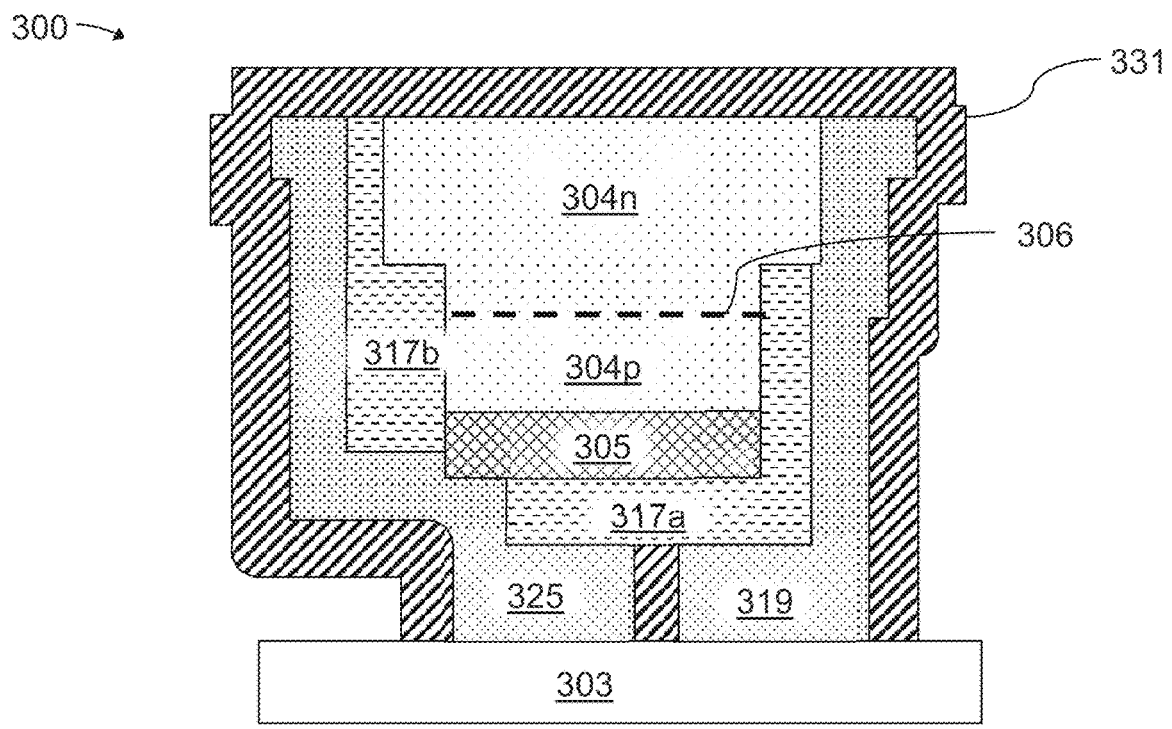
FIG. 3B illustrates a cross-sectional view of a singulated uLED device according to one or more embodiments where the anode and the cathode are bonded to a support and a passivation layer is deposited.

FIG. 3B illustrates a cross-sectional view of the uLED device of FIG. 3A where the anode and the cathode are bonded to a support 303 and a passivation layer is deposited 331. In one or more embodiments, the uLED devices herein further comprise a passivation layer 331 located on the cathode 319, the anode 225, and a second portion of the first region of dielectric material 317a.

Figure 4:
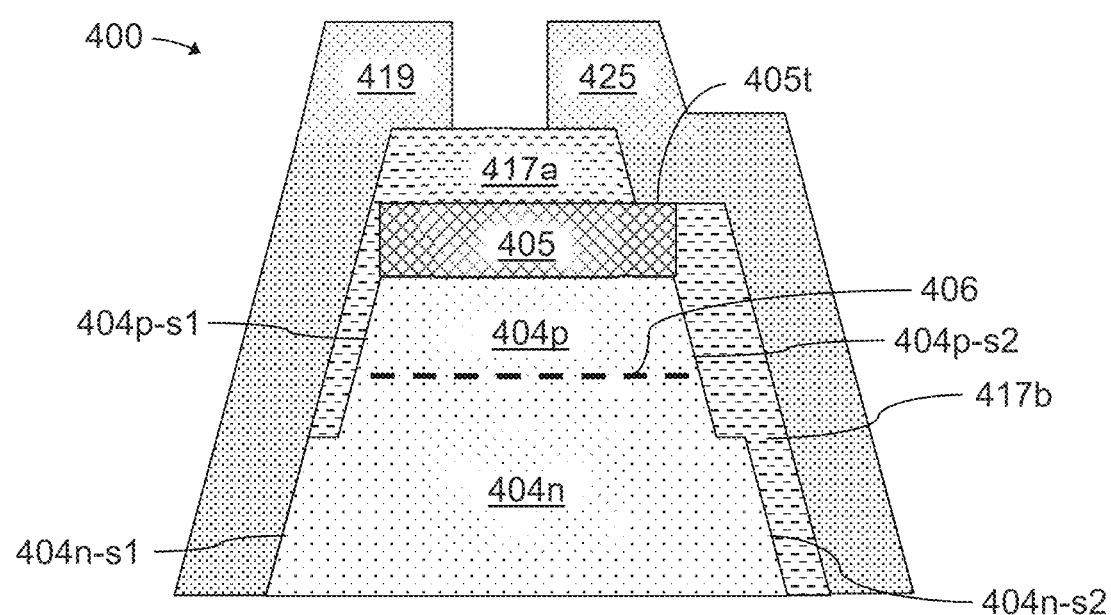
FIG. 4 illustrates a cross-sectional view of a singulated uLED device according to one or more embodiments.

FIG. 4 is a cross-sectional view of a singulated uLED device 400 according to one or more embodiments made in accordance with FIGS. 1A-J and FIG. 5. The uLED of FIG. 4 is analogous to the uLED of FIG. 2, differing in that the walls that are angled relative to the underlying substrate on which it was formed (not shown). This is achievable by anisotropic etching selected for a desired angle. In FIG. 4, a mesa comprises a plurality of semiconductor layers including an n-type layer 404n, an active layer 406, and a p-type layer 404p. A p-contact layer 405 contacts the p-type layer 404p. A cathode 419 contacts a first sidewall of the n-type layer 404n-s1. A first region of dielectric material 417a insulates the p-contact layer 404p, the active layer 406, and a first sidewall of the p-type layer 404p-s1 from the cathode 419. An anode 425 contacts the top surface of the p-contact layer 405t. A second region of dielectric material 417b insulates the active layer 406, a second sidewall of the p-type layer 404ps-2, and the second sidewall of the n-type layer 404n-s2 from the anode 425.

Display Devices

Figure 6:
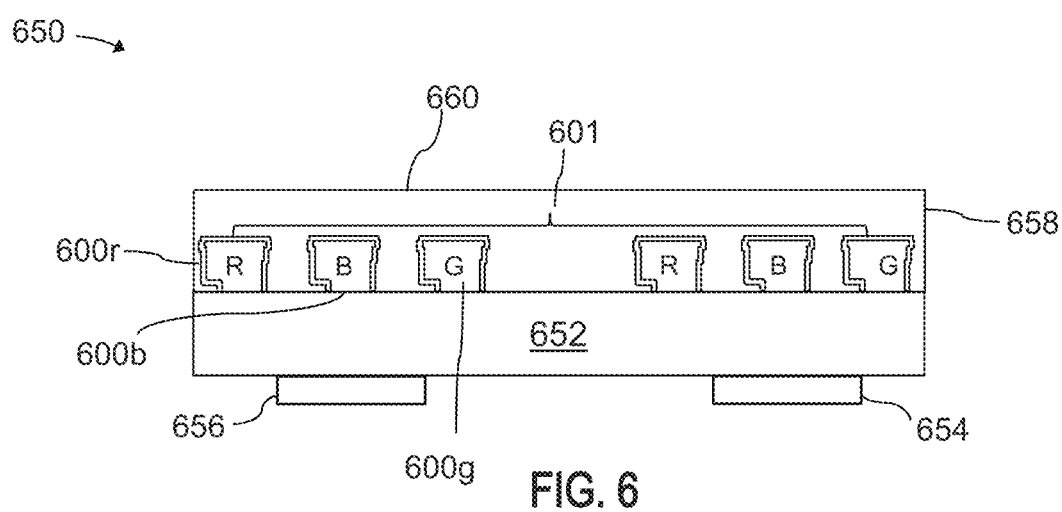
FIG. 6 schematically illustrates an exemplary display device.

FIG. 6 schematically illustrates an exemplary display device utilizing uLED devices disclosed herein. In one or more embodiments, the display device is an LED illumination array and lens system. In one or more embodiments, the display device is an LED light emitting array. As shown in FIG. 6, display device 650 comprises a plurality or array of uLEDs 601 of varying colors, 600r for a red pixel, 600b for a blue pixel, and 600g for a green pixel. In one or more embodiments, each of the uLEDs is individually addressable and illuminable. It is understood that the number of each color and arrangement of the same will be application-specific. The plurality of pixels are attached to a backplane 652. In one or more embodiments, an automatic pick-and-place device removes each uLED from a support (e.g., 303 of FIGS. 3A-3B), and mounts the uLED on the backplane, and welds the bonding surfaces of the uLED (e.g. first bonding surface 319-$s1$ of the cathode and second bonding surface 325-$s1$ of the anode), which may be conducted by any combination of thermal and/or ultrasonic and/or compressive methods, to the backplane. In one or more embodiments, there is a bonding metal pattern on the backplane to correspond to the bonding surfaces of the uLED. The plurality of pixels are enclosed in a housing 358, which has a display face (or lens or other optical feature) 660. Electrodes 654 and 656 electrically connect the backplane 652 to a driver integrated circuit (not shown).

In one or more embodiments, arrays of micro-LEDs (μLEDs or uLEDs) are used. Micro-LEDs can support high density pixels having a lateral dimension less than 100 μm by 100 μm. In some embodiments, micro-LEDs with dimensions of about 50 μm in diameter or width and smaller can be used. Such micro-LEDs can be used for the manufacture of color displays by aligning in close proximity micro-LEDs comprising red, blue and green wavelengths.

In some embodiments, the light emitting arrays include small numbers of micro-LEDs positioned on substrates that are centimeter scale area or greater. In some embodiments, the light emitting arrays include micro-LED pixel arrays with hundreds, thousands, or millions of light emitting LEDs positioned together on centimeter scale area substrates or smaller. In some embodiments, micro-LEDs can include light emitting diodes sized between 30 microns and 500 microns. The light emitting array(s) can be monochromatic, RGB, or other desired chromaticity. In some embodiments, pixels can be square, rectangular, hexagonal, or have curved perimeter. Pixels can be of the same size, of differing sizes, or similarly sized and grouped to present larger effective pixel size.

In some embodiments, light emitting pixels and circuitry supporting light emitting arrays are packaged and optionally include a submount or printed circuit board connected for powering and controlling light production by semiconductor LEDs. In certain embodiments, a printed circuit board supporting light emitting array includes electrical vias, heat sinks, ground planes, electrical traces, and flip chip or other mounting systems. The submount or printed circuit board may be formed of any suitable material, such as ceramic, silicon, aluminum, etc. If the submount material is conductive, an insulating layer is formed over the substrate material, and the metal electrode pattern is formed over the insulating layer. The submount can act as a mechanical support, providing an electrical interface between electrodes on the light emitting array and a power supply, and also provide heat sink functionality.

In some embodiments, LED light emitting arrays include optical elements such as lenses, metalenses, and/or pre-collimators. Optical elements can also or alternatively include apertures, filters, a Fresnel lens, a convex lens, a concave lens, or any other suitable optical element that affects the projected light from the light emitting array. Additionally, one or more of the optical elements can have one or more coatings, including UV blocking or anti-reflective coatings. In some embodiments, optics can be used to correct or minimize two- or three dimensional optical errors including pincushion distortion, barrel distortion, longitudinal chromatic aberration, spherical aberration, chromatic aberration, field curvature, astigmatism, or any other type of optical error. In some embodiments, optical elements can be used to magnify and/or correct images. Advantageously, in some embodiments magnification of display images allows the light emitting array to be physically smaller, of less weight, and require less power than larger displays. Additionally, magnification can increase a field of view of the displayed content allowing display presentation equals a user's normal field of view.

Applications

Figure 7:
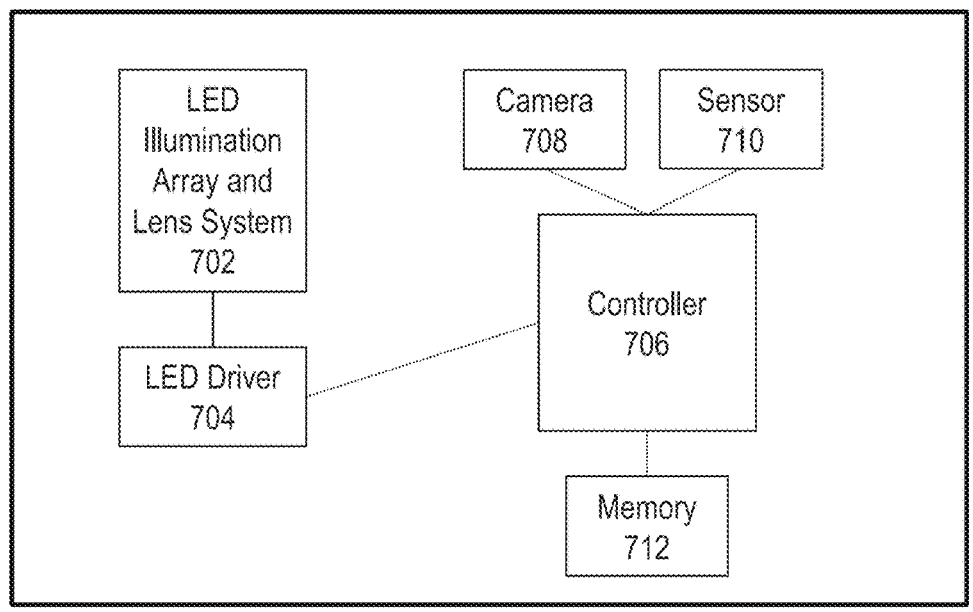
FIG. 7 schematically illustrates an exemplary camera flash system comprising uLEDs according to embodiments herein.

FIG. 7 schematically illustrates an exemplary camera flash system 700 utilizing uLEDs disclosed herein. The camera flash system 700 comprises an LED illumination array and lens system 702 in electrical communication with an LED driver 704. The camera flash system 700 also comprises a controller 706, such as a microprocessor. The controller 706 is coupled to the LED driver 704. The controller 706 may also be coupled to a camera 708 and to sensor(s) 710, and operate in accordance with instructions and profiles stored in memory 712. The camera 708 and the LED illumination array and lens system 702 may be controlled by the controller 706 to match their fields of view.

Sensors 710 may include, for example, positional sensors (e.g., a gyroscope and/or accelerometer) and/or other sensors that may be used to determine the position, speed, and orientation of system 700. The signals from the sensors 710 may be supplied to the controller 706 to be used to determine the appropriate course of action of the controller 706 (e.g., which LEDs are currently illuminating a target and which LEDs will be illuminating the target a predetermined amount of time later).

In operation, illumination from some or all of the pixels of the LED array in 702 may be adjusted—deactivated, operated at full intensity, or operated at an intermediate intensity. As noted above, beam focus or steering of light emitted by the LED array in 702 can be performed electronically by activating one or more subsets of the pixels, to permit dynamic adjustment of the beam shape without moving optics or changing the focus of the lens in the lighting apparatus.

LED illumination arrays and lens systems such as described herein may support various other beam steering or other applications that benefit from fine-grained intensity, spatial, and temporal control of light distribution. These applications may include, but are not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. Associated optics may be distinct at a pixel, pixel block, or device level. An example light emitting pixel array may include a device having a commonly controlled central block of high intensity pixels with an associated common optic, whereas edge pixels may have individual optics. In addition to flashlights, common applications supported by light emitting pixel arrays include video lighting, automotive headlights, architectural and area illumination, and street lighting.

Figure 8:
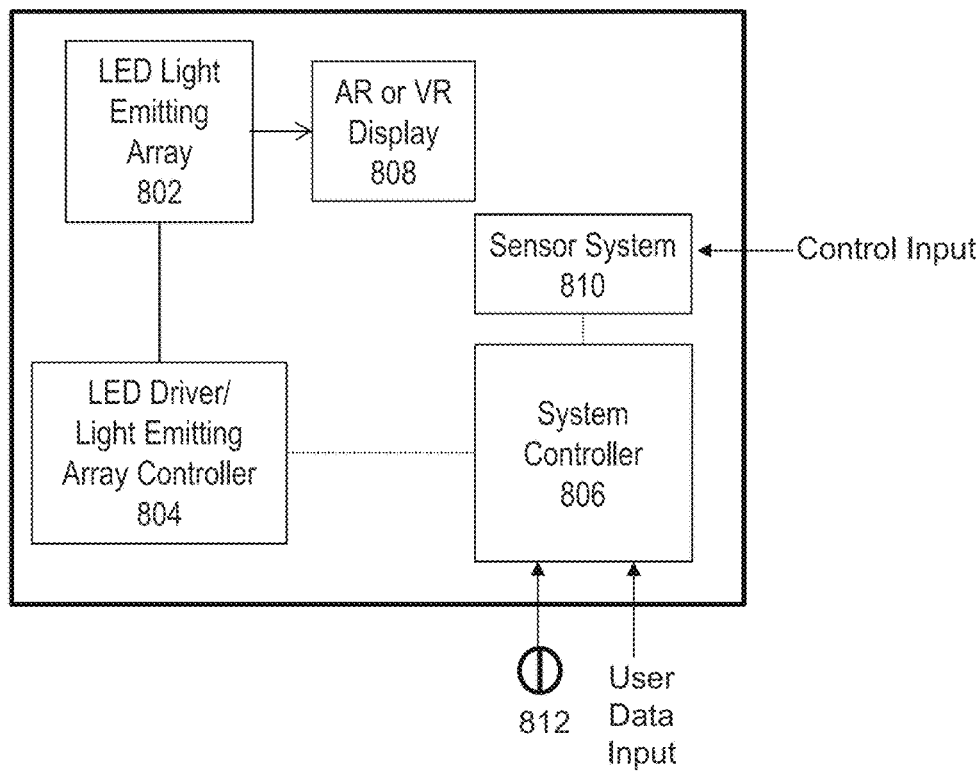
FIG. 8 schematically illustrates an exemplary augmented reality/virtual reality (AR/VR) system comprising uLEDs according to embodiments herein.

FIG. 8 schematically illustrates an exemplary augmented reality/virtual reality (AR/VR) system 800 utilizing uLEDs disclosed herein. One or more AR/VR systems include: augmented (AR) or virtual reality (VR) headsets, glasses, or projectors. The AR/VR system 800 includes an LED light emitting array 802, an LED driver (or light emitting array controller) 804, a system controller 806, an AR or VR display 808, a sensor system 810. Control input is provided to the sensor system 810, while power 812 and user data input is provided to the system controller 806. As will be understood, in some embodiments modules included in the AR/VR system 800 can be compactly arranged in a single structure, or one or more elements can be separately mounted and connected via wireless or wired communication. For example, the light emitting array 802, AR or VR display 808, and sensor system 810 can be mounted on a headset or glasses, with the LED driver 804 and/or system controller 806 separately mounted.

In one embodiment, the light emitting array 802 can be used to project light in graphical or object patterns that can support AR/VR systems. In some embodiments, separate light emitting arrays can be used to provide display images, with AR features being provided by a distinct and separate micro-LED array. In some embodiments, a selected group of pixels can be used for displaying content to the user while tracking pixels can be used for providing tracking light used in eye tracking. Content display pixels are designed to emit visible light, with at least some portion of the visible band (approximately 400 nm to 750 nm). In contrast, tracking pixels can emit light in visible band or in the IR band (approximately 750 nm to 2,200 nm), or some combination thereof. As an alternative example, the tracking pixels could operate in the 800 to 1000 nanometer range. In some embodiments, the tracking pixels can emit tracking light during a time period that content pixels are turned off and are not displaying content to the user.

The AR/VR system 800 can incorporate a wide range of optics in the LED light emitting array 802 and/or AR/VR display 808, for example to couple light emitted by the LED light emitting array 802 into AR/VR display 808 as discussed above. For AR/VR applications, these optics may comprise nanofins and be designed to polarize the light they transmit.

In one embodiment, the light emitting array controller 804 can be used to provide power and real time control for the light emitting array 802. For example, the light emitting array controller 804 can be able to implement pixel or group pixel level control of amplitude and duty cycle. In some embodiments, the light emitting array controller 804 further includes a frame buffer for holding generated or processed images that can be supplied to the light emitting array 802. Other supported modules can include digital control interfaces such as Inter-Integrated Circuit (I2C) serial bus, Serial Peripheral Interface (SPI), USB-C, HDMI, Display Port, or other suitable image or control modules that are configured to transmit needed image data, control data or instructions.

In operation, pixels in the images can be used to define response of corresponding light emitting array 802, with intensity and spatial modulation of LED pixels being based on the image(s). To reduce data rate issues, groups of pixels (e.g. 5×5 blocks) can be controlled as single blocks in some embodiments. In some embodiments, high speed and high data rate operation is supported, with pixel values from successive images able to be loaded as successive frames in an image sequence at a rate between 30 Hz and 100 Hz, with 60 Hz being typical. Pulse width modulation can be used to control each pixel to emit light in a pattern and with an intensity at least partially dependent on the image.

In some embodiments, the sensor system 810 can include external sensors such as cameras, depth sensors, or audio sensors that monitor the environment, and internal sensors such as accelerometers or two or three axis gyroscopes that monitor AR/VR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position. As another example, based on the one or more measurement signals from one or more gyroscope or position sensors that measure translation or rotational movement, an estimated position of AR/VR system 800 relative to an initial position can be determined.

In some embodiments, the system controller 806 uses data from the sensor system 810 to integrate measurement signals received from the accelerometers over time to estimate a velocity vector and integrate the velocity vector over time to determine an estimated position of a reference point for the AR/VR system 800. In other embodiments, the reference point used to describe the position of the AR/VR system 800 can be based on depth sensor, camera positioning views, or optical field flow.

Based on changes in position, orientation, or movement of the AR/VR system 800, the system controller 806 can send images or instructions the light emitting array controller 804. Changes or modification the images or instructions can also be made by user data input, or automated data input as needed. User data input can include but is not limited to that provided by audio instructions, haptic feedback, eye or pupil positioning, or connected keyboard, mouse, or game controller.

EMBODIMENTS

Various embodiments are listed below. It will be understood that the embodiments listed below may be combined with all aspects and other embodiments in accordance with the scope of the invention.

Embodiment (a). A micro-light emitting diode (uLED) device comprising: a mesa comprising: a plurality of semiconductor layers including an n-type layer, an active layer, and a p-type layer; a p-contact layer contacting the p-type layer; the mesa comprising a height spanning from a top surface of the p-contact layer to a bottom surface of the n-type layer and a width spanning a first sidewall of the n-type layer to a second sidewall of the n-type layer; the top surface of the p-contact layer having a different planar orientation compared to the first and second sidewalls of the n-type layer; a cathode contacting the first sidewall of the n-type layer; a first region of dielectric material that insulates the p-contact layer, the active layer, and a first sidewall of the p-type layer from the cathode; an anode contacting the top surface of the p-contact layer; and a second region of dielectric material that insulates the active layer, a second sidewall of the p-type layer, and the second sidewall of the n-type layer from the anode.

Embodiment (b). The uLED device of embodiment (a), wherein the width of the mesa is less than 100 micrometers.

Embodiment (c). The uLED device of any one of embodiments (a) to (b), wherein the height of the mesa is less than or equal to the width of the mesa.

Embodiment (d). The uLED device of any one of embodiments (a) to (c), wherein the cathode and the anode both longitudinally span the uLED device.

Embodiment (e). The uLED device of any one of embodiments (a) to (d), wherein the p-contact layer contacting the p-type layer substantially spans a width of the p-type layer.

Embodiment (f). The uLED device of any one of embodiments (a) to (e), wherein the cathode wraps around a portion of the n-type layer and a first portion of the first region of the dielectric material.

Embodiment (g). The uLED device of any one of embodiments (a) to (f), wherein the anode wraps around portions of the p-contact layer and the second region of the dielectric material.

Embodiment (h). The uLED device of any one of embodiments (a) to (g), wherein a first longitudinal surface of the cathode defines a first bonding surface of the uLED and a first longitudinal surface of the anode defines a second bonding surface of the uLED, the first longitudinal surface of the cathode and the first longitudinal surface of the anode being located on a same side of the p-contact layer.

Embodiment (i). The uLED device of embodiment (h), wherein the first longitudinal surface of the cathode and the first longitudinal surface of the anode are planar.

Embodiment (j). The uLED device of any one of embodiments (a) to (i), wherein a second longitudinal surface of the cathode defines a first liftoff edge of the uLED and a second longitudinal surface of the anode defines a second liftoff edge of the uLED, the second longitudinal surface of the cathode and the second longitudinal surface of the anode being located on opposite sides of the n-type layer.

Embodiment (k). The uLED device of any one of embodiments (a) to (j) comprising a passivation layer located on the cathode, the anode, and a second portion of the first region of dielectric material.

Embodiment (l). The uLED device of any one of embodiments (a) to (k), wherein the cathode contacts two planar orientations of the n-type layer.

Embodiment (m). The uLED device of any one of embodiments (a) to (l), the anode contacts two planar orientations of the p-contact layer.

Embodiment (n). The uLED device of any one of embodiments (a) to (m), wherein the semiconductor layers have a total thickness in a range of from 2 µm to 10 µm.

Embodiment (o). The uLED device of any one of embodiments (a) to (n), wherein the n-type layer comprises N-GaN and the p-type layer comprises P-GaN.

Embodiment (p). The uLED device of any one of embodiments (a) to (o), wherein the dielectric material of the first region and of the second region independently each comprise a material selected from the group consisting of $SiO_2$, $AlO_x$, and SiN, each independently has a thickness in a range of from 200 nm to 1 µm.

Embodiment (q). A display device comprising: a backplane; a plurality of individually-placed uLED devices attached to the backplane, each of the uLED devices comprising a uLED according any one of embodiments (a) to (p); and a housing including a display face enclosing the plurality of individually-placed uLED devices.

Embodiment (r). The display device of embodiment (q), wherein each of the uLEDs is according to any one of embodiments (a) to (p).

Embodiment (s). A display system comprising the display device of any one of embodiments (q) to (r) and one or more controllers in communication with the plurality of uLED devices.

Embodiment (t). The display system of embodiment (s), wherein the plurality of uLED devices are independently controllable.

Embodiment (u). A method of manufacturing a micro-light emitting diode (uLED) device comprising: depositing a plurality of semiconductor layers including an n-type layer, an active layer, and a p-type layer on a substrate; depositing a p-contact layer on the plurality of semiconductor layers; depositing a hard mask layer on the p-contact layer; etching a portion of the semiconductor layers, the p-contact layer, and the hard mask layer to form trenches and plurality of mesas, each of the mesas having a height spanning from a top surface of the p-contact layer to a bottom surface of the n-type layer and a width spanning a first sidewall of the n-type layer to a second sidewall of the n-type layer; depositing a dielectric metal over the substrate into the trenches and on an uppermost surface of the substrate; first etching to expose the p-contact layer and a first portion of a surface of the substrate; second etching to expose the n-type layer and a second portion of the surface of the substrate; depositing a first metal onto areas exposed by the first etching and the second etching; and etching to form a cathode and an anode which are isolated from each other; the foregoing steps forming a processed structure.

Embodiment (v). The method of embodiment (u), wherein the width of the mesa is less than 100 micrometers.

Embodiment (w). The method of embodiment (u) or (v), wherein the height of the mesa is less than or equal to the width of the mesa.

Embodiment (x). The method of any one of embodiments (u) to (w), wherein the first etching and/or the second etching independently comprise anisotropic etching.

Embodiment (y). The method of any one of embodiments (u) to (x) comprising conducting a masking prior to the etching to expose the p-contact layer.

Embodiment (z). The method of any one of embodiments (u) to (y), wherein two planar orientations of the p-contact layer are exposed during the etching to expose the p-contact layer.

Embodiment (aa). The method of any one of embodiments (u) to (z), wherein two planar orientations of the n-layer are exposed during the etching to expose the n-layer.

Embodiment (bb). The method of any one of embodiments (u) to (aa) comprising conducting a masking prior to the etching to expose the n-type layer.

Embodiment (cc). The method of any one of embodiments (u) to (bb), comprising forming a passivation layer on the processed structure.

Embodiment (dd). The method of any one of embodiments (u) to cc) comprising adhering bonding surfaces of the cathode and the anode to a support; removing the substrate; and singulating the mesas to form individual uLED devices.

Embodiment (ee). The method of any one of embodiments (u) to (dd), wherein the n-type layer comprises N-GaN and the p-type layer comprises P-GaN.

Embodiment (ff). The method of any one of embodiments (u) to (ee), wherein the dielectric material of the first region and of the second region independently each comprise a material selected from the group consisting of $SiO_2$, $AlO_x$, and SiN, each independently has a thickness in a range of from 200 nm to 1 µm.

Embodiment (gg). The method of any one of embodiments (u) to (ff), wherein the p-contact layer contacting the p-type layer substantially spans a width of the p-type layer.

Embodiment (hh). The method of any one of embodiments (u) to (gg), wherein the p-type layer substantially spans a width of the active layer.

Embodiment (ii). A method of making a display device comprising: attaching plurality of micro light emitting diodes (uLEDs) to a backplane by a pick-and-place method; and enclosing the plurality of LEDs in a housing with a display face; each of the uLEDS comprising a uLED according any one of embodiments (a) to (p).

Embodiment (jj). The method of embodiment (ii), wherein the width of the mesa is less than 100 micrometers.

Embodiment (kk). The method of any of embodiments (ii) to (jj), wherein the height of the mesa is less than or equal to the width of the mesa.

Embodiment (ll). The method of any of embodiments (ii) to (kk), wherein the p-contact layer contacting the p-type layer substantially spans a width of the p-type layer.

Embodiment (mm). The method of any of embodiments (ii) to (ll), wherein the p-type layer substantially spans a width of the active layer.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

What is claimed is:

1. A method of manufacturing a micro-light emitting diode (uLED) device comprising:
    depositing a plurality of semiconductor layers including an n-type layer, an active layer, and a p-type layer on a substrate;
    depositing a p-contact layer on the plurality of semiconductor layers;
    depositing a hard mask layer on the p-contact layer;
    etching a portion of the semiconductor layers, the p-contact layer, and the hard mask layer to form trenches and plurality of mesas, each of the mesas having a height spanning from a top surface of the p-contact layer to a bottom surface of the n-type layer and a width spanning a first sidewall of the n-type layer to a second sidewall of the n-type layer;
    depositing a dielectric metal over the substrate into the trenches and on an uppermost surface of the substrate;
    first etching to expose the p-contact layer and a first portion of a surface of the substrate;
    second etching to expose the n-type layer and a second portion of the surface of the substrate;
    depositing a first metal onto areas exposed by the first etching and the second etching; and
    etching to form a cathode and an anode which are isolated from each other;
    the foregoing steps forming a processed structure.

2. The method of claim 1, wherein the width of the mesa is less than 100 micrometers.

3. The method of claim 1, wherein the height of the mesa is less than or equal to the width of the mesa.

4. The method of claim 1, wherein the first etching and/or the second etching independently comprise anisotropic etching.

5. The method of claim 1 comprising conducting a masking prior to the etching to expose the p-contact layer.

6. The method of claim 1, wherein two planar orientations of the p-contact layer are exposed during the etching to expose the p-contact layer.

7. The method of claim 1, wherein two planar orientations of the n-layer are exposed during the etching to expose the n-layer.

8. The method of claim 1 comprising conducting a masking prior to the etching to expose the n-type layer.

9. The method of claim 1 comprising forming a passivation layer on the processed structure.

10. The method of claim 1 comprising adhering bonding surfaces of the cathode and the anode to a support; removing the substrate; and singulating the mesas to form individual uLED devices.

11. The method of claim 1, wherein the n-type layer comprises N-GaN and the p-type layer comprises P-GaN.

12. The method of claim 1, wherein the dielectric material of the first region and of the second region independently each comprise a material selected from the group consisting of $SiO_2$, $AlO_x$, and SiN, each independently has a thickness in a range of from 200 nm to 1 µm.

13. The method of claim 1, wherein the p-contact layer contacting the p-type layer substantially spans a width of the p-type layer.

14. The method of claim 1, wherein the p-type layer substantially spans a width of the active layer.

15. A method of making a display device comprising:
    attaching plurality of micro light emitting diodes (uLEDs) to a backplane by a pick-and-place method; and
    enclosing the plurality of LEDs in a housing with a display face;
    each of the uLEDS comprising:
        a mesa comprising:
            a plurality of semiconductor layers including an n-type layer, an active layer, and a p-type layer;
            a p-contact layer contacting the p-type layer;
            the mesa comprising a height spanning from a top surface of the p-contact layer to a bottom surface of the n-type layer and a width spanning a first sidewall of the n-type layer to a second sidewall of the n-type layer; the top surface of the p-contact layer having a different planar orientation compared to the first and second sidewalls of the n-type layer;
        a cathode contacting the first sidewall of the n-type layer;
        a first region of dielectric material that insulates the p-contact layer, the active layer, and a first sidewall of the p-type layer from the cathode;
        an anode contacting the top surface of the p-contact layer; and
        a second region of dielectric material that insulates the active layer, a second sidewall of the p-type layer, and the second sidewall of the n-type layer from the anode.

16. The method of claim 15, wherein the width of the mesa is less than 100 micrometers.

17. The method of claim 15, wherein the height of the mesa is less than or equal to the width of the mesa.

18. The method of claim 15, wherein the p-contact layer contacting the p-type layer substantially spans a width of the p-type layer.

19. The method of claim 15, wherein the p-type layer substantially spans a width of the active layer.

* * * * *